United States Patent
Yuan et al.

(10) Patent No.: US 9,562,953 B2
(45) Date of Patent: Feb. 7, 2017

(54) MAGNETIC FIELD SENSING MODULE, MEASUREMENT METHOD, AND MANUFACTURING METHOD OF A MAGNETIC FIELD SENSING MODULE

(71) Applicants: Fu-Te Yuan, New Taipei (TW); Meng-Huang Lai, New Taipei (TW); Jen-Tzong Jeng, New Taipei (TW)

(72) Inventors: Fu-Te Yuan, New Taipei (TW); Meng-Huang Lai, New Taipei (TW); Jen-Tzong Jeng, New Taipei (TW)

(73) Assignee: iSentek Inc., New Taipei (TW)

( * ) Notice: Subject to any disclaimer, the term of this patent is extended or adjusted under 35 U.S.C. 154(b) by 213 days.

(21) Appl. No.: 14/283,236

(22) Filed: May 21, 2014

(65) Prior Publication Data

US 2015/0137804 A1  May 21, 2015

Related U.S. Application Data

(60) Provisional application No. 61/905,268, filed on Nov. 17, 2013.

(30) Foreign Application Priority Data

Jan. 24, 2014  (TW) .............................. 103102698 A

(51) Int. Cl.
*G01R 33/02* (2006.01)
*G01R 33/00* (2006.01)
*G01R 33/09* (2006.01)

(52) U.S. Cl.
CPC ....... *G01R 33/0011* (2013.01); *G01R 33/0005* (2013.01); *G01R 33/02* (2013.01); *G01R 33/09* (2013.01)

(58) Field of Classification Search
CPC ..... G01R 33/02; G01R 33/06; G01R 33/0011; G01R 33/09
(Continued)

(56) References Cited

U.S. PATENT DOCUMENTS 5,793,200 A * 8/1998 Berrill .................... G01D 5/145
324/207.12
7,358,722 B2   4/2008 Peczalski et al.
(Continued)

FOREIGN PATENT DOCUMENTS

| JP | 2006508544 | 3/2006 |
|---|---|---|
| TW | 200528739 | 9/2005 |
| TW | 201142336 | 12/2011 |

OTHER PUBLICATIONS

"Office Action of Taiwan Counterpart Application", issued on Jun. 18, 2015, p. 1-p. 10, 103102698.

*Primary Examiner* — Reena Aurora
(74) *Attorney, Agent, or Firm* — Jianq Chyun IP Office

(57) ABSTRACT

A magnetic field sensing module including a plurality of magnetic flux concentrators and a plurality of sensing elements is provided. Each of the magnetic flux concentrators extends along a first extension direction, and the magnetic flux concentrators are arranged along a second direction. The sensing elements are respectively disposed at a position corresponding to a position between the magnetic flux concentrators and positions corresponding to two sides of the magnetic flux concentrators arranged along the second direction. Sensing directions of the sensing elements are substantially the same. A measurement method and a manufacturing method of a magnetic field sensing module are also provided.

11 Claims, 20 Drawing Sheets

(58) Field of Classification Search
USPC .......................................................... 324/244
See application file for complete search history.

(56) References Cited

U.S. PATENT DOCUMENTS

| | | | |
|---|---|---|---|
| 8,169,215 B2 | 5/2012 | Kataoka et al. | |
| 9,335,386 B2* | 5/2016 | Fu ........................ | G01R 33/096 |
| 2010/0007339 A1 | 1/2010 | Ausserlechner | |
| 2010/0072992 A1 | 3/2010 | Bauer | |
| 2012/0200292 A1 | 8/2012 | Sugihara et al. | |
| 2012/0217961 A1 | 8/2012 | Ando et al. | |
| 2013/0257423 A1 | 10/2013 | Chang et al. | |

* cited by examiner

MAGNETIC FIELD SENSING MODULE, MEASUREMENT METHOD, AND MANUFACTURING METHOD OF A MAGNETIC FIELD SENSING MODULE

CROSS-REFERENCE TO RELATED APPLICATION

This application claims the priority benefits of U.S. provisional application Ser. No. 61/905,268, filed on Nov. 17, 2013 and Taiwan application serial no. 103102698, filed on Jan. 24, 2014. The entirety of each of the above-mentioned patent applications is hereby incorporated by reference herein and made a part of this specification.

BACKGROUND OF THE INVENTION

1. Field of the Invention

The invention relates to a magnetic field sensing module, a measurement method, and a manufacturing method of a magnetic field sensing module.

2. Description of Related Art

As the portable electronic devices become popular, the technology of electronic compasses capable of sensing the geomagnetic direction becomes more and more important. When the electronic compasses are used in portable electronic devices having a compact size (e.g. smart phones), it is preferred that the electronic compasses are capable of tri-axial sensing in addition to meeting the size requirement. This is because the user may hold the cell phone tilted when hand-holding the phone, and a variety of holding angles are all possible.

To achieve tri-axial sensing, a conventional technology is to use the tilted wafer technology, which etches a silicon substrate to form a tilted surface and then forms a giant magnetoresistance (GMR) multi-film structure or tunneling magnetoresistance (TMR) multi-film structure on the tilted surface. However, depositing a thin film on the tilted surface may easily result in an uneven thickness of the thin film, and the etching process performed on the thin film is more difficult and hard to control the yield rate.

Another conventional technology is to use a composite sensing element to achieve tri-axial sensing. Specifically speaking, two GMR multi-film structures (or TMR multi-film structures) disposed to be perpendicular to each other and a Hall element are used for tri-axial sensing. However, since the sensitivity of the Hall element differs from the sensitivity of the GMR or TMR multi-film structures, the accuracy of one of the axes may be different from the accuracies of the other two axes. In this way, when the user rotates the electronic device to a different angle, the sensitivity to the same magnetic field may differ, and the trouble in use is thus caused.

In the conventional technology, two or more manufacturing processes are commonly used to achieve multi-axial sensing of the magnetic field. Namely, the manufacturing processes using two or more wafers to manufacture a multi-axial magnetic field sensing module, which complicate the manufacture process and make it difficult to reduce the manufacturing cost.

SUMMARY OF THE INVENTION

The invention provides a magnetic field sensing module capable of using a plurality of sensing elements having the same sensing direction to achieve multi-axial magnetic field sensing.

The invention provides a measurement method capable of achieving multi-axial magnetic field sensing in a simple way.

The invention provides a manufacturing method of a magnetic field sensing method, which is capable of manufacturing a magnetic field sensing module that achieves multi-axial magnetic field sensing in a simple manufacture process.

A magnetic field sensing module according to an embodiment of the invention includes a plurality of magnetic flux concentrators and a plurality of sensing elements. Each of the magnetic flux concentrators extends along a first direction, and the magnetic flux concentrators are arranged along a second direction. The sensing elements are respectively disposed in a position corresponding to a position between the magnetic flux concentrators and positions corresponding to two sides of the magnetic flux concentrators arranged in the second direction. In addition, sensing directions of the sensing elements are substantially the same.

A measurement method according to an embodiment of the invention is configured to measure an external magnetic field. The measurement method includes: modifying a magnetic field distribution of the external magnetic field, so as to convert at least a portion of each of components of the external magnetic field in a first direction, a second direction, and a third direction at a plurality of different positions to the second direction, and sensing a magnitude of a magnetic field in the second direction at the different positions, so as to measure component magnitudes of the external magnetic field in the first, second and third directions.

A manufacturing method of a magnetic field sensing module according to an embodiment of the invention includes: providing a substrate; forming a magnetic sensing multi-film structure on the substrate; etching a first portion of the magnetic sensing multi-film structure, wherein a remaining second portion of the magnetic sensing multi-film structure forms a plurality of sensing elements separated from each other; forming an insulating layer covering the substrate and the sensing elements; and forming a plurality of magnetic flux concentrators, wherein each of the magnetic flux concentrators extends along a first direction, the magnetic flux concentrators are arranged along a second direction, and the sensing elements are respectively disposed below a position between the magnetic flux concentrators, below positions at two sides of the magnetic flux concentrators arranged in the second direction, and under the magnetic flux concentrators.

In the magnetic field sensing module in the embodiments of the invention, the external magnetic field is bent by using the magnetic flux concentrators, so that the sensing directions of the plurality of sensing elements may be substantially the same, and the magnetic field sensing module may achieve multi-axial magnetic field sensing under a simpler framework, thereby reducing the complexity and cost of manufacture of the magnetic field sensing module. In the measurement method according to the embodiments of the invention, the external magnetic field is converted to the same direction by modifying the magnetic field distribution of the external magnetic field, so as to actually achieve multi-axial magnetic field sensing by sensing the external magnetic field in the same direction. Therefore, the measurement method is capable of achieving multi-axial magnetic field sensing in a simpler way. In the manufacturing method of the magnetic field sensing module according to the embodiments of the invention, the magnetic multi-layer structure is etched to form the plurality of sensing elements separated from each other, then the magnetic flux concentrators are formed to complete the manufacture of the multi-axial magnetic field sensing module. Accordingly, the manufacturing method manufactures the magnetic field sensing module capable of multi-axial magnetic field sensing by use a simpler manufacturing process.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
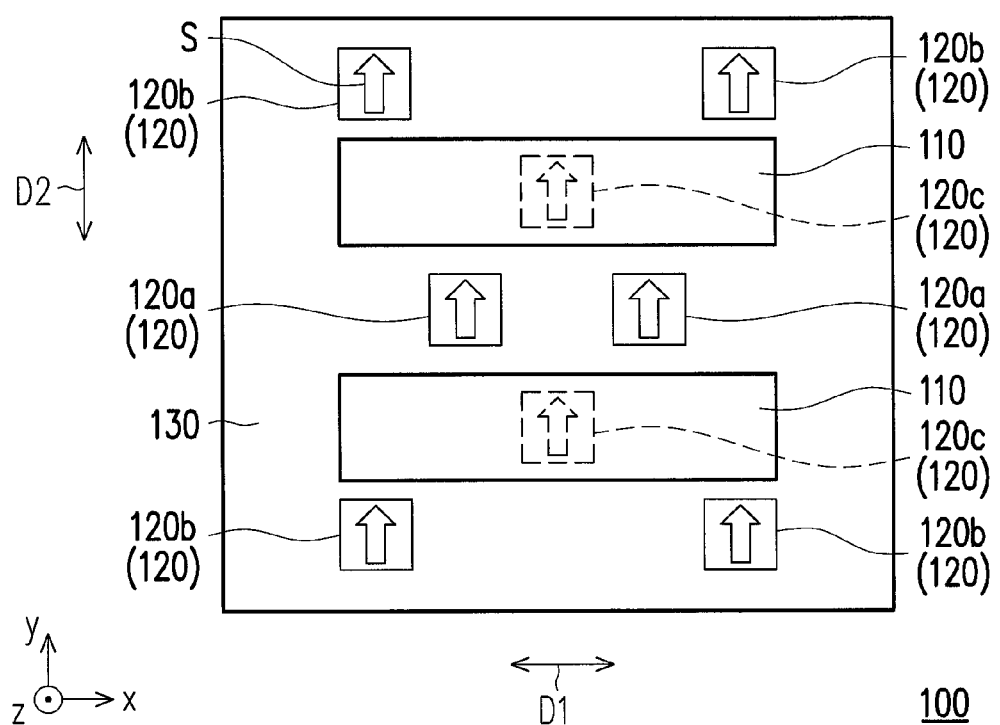
FIG. 1A is a schematic structural top view of a magnetic field sensing module according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
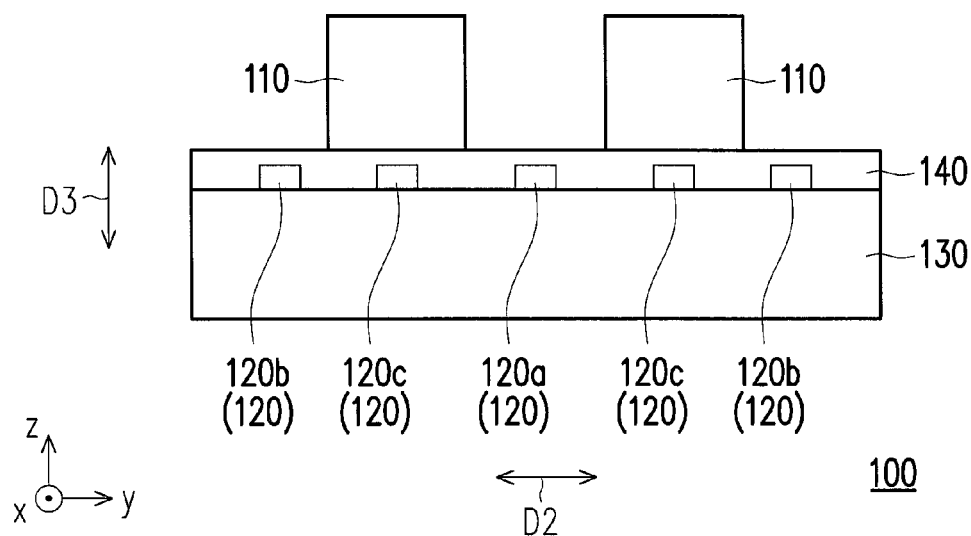
FIGS. 1B and 1C are schematic structural side views of the magnetic field sensing module of FIG. 1A in two different directions.
Figure 1C:
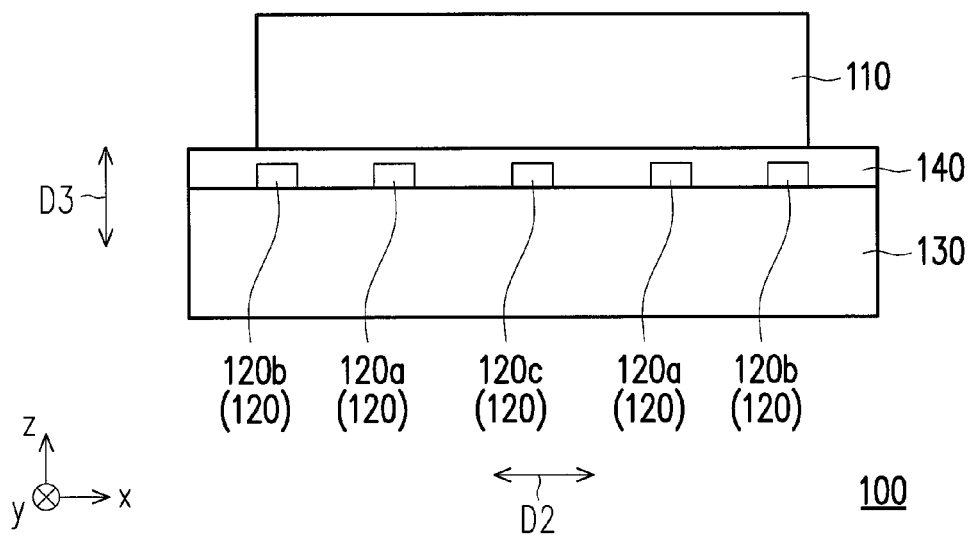

FIG. 1A is a schematic structural top view of a magnetic field sensing module according to an embodiment of the invention, and FIGS. 1B and 1C are schematic structural side views of the magnetic field sensing module of FIG. 1A in two different directions. Referring to FIGS. 1A to 1C, a magnetic field sensing module 100 includes a plurality of magnetic flux concentrators 110 and a plurality of sensing elements 120. Each of the magnetic flux concentrators 110 extends along a first direction D1 (parallel to x direction), and the magnetic flux concentrators 110 are arranged along a second direction D2 (parallel to y direction). In this embodiment, a residual magnetism of the magnetic flux concentrators 110 is less than 10% of a saturation magnetization thereof. For example, the magnetic flux concentrators 110 are formed of a soft magnetic material, such as a nickel-iron (NiFe) alloy, cobalt-iron (CoFe) alloy, cobalt-iron-boron (CoFeB) alloy, ferrite, or other high permeability materials.

The sensing elements 120 are respectively disposed at a position corresponding to a position between the magnetic flux concentrators 110 (e.g. a position corresponding to a central line between two adjacent of the magnetic flux concentrators 110) and positions corresponding to two sides of the magnetic flux concentrators 110 arranged in the second direction D2. For example, a sensing element 120a of the sensing elements 120 is disposed at the position corresponding to the position between the magnetic flux concentrators 110. In the illustration of FIG. 1B, the sensing element 120a is located below the magnetic flux concentrators 110. In addition, sensing elements 120b of the sensing elements 120 are disposed at the positions corresponding to the two sides of the magnetic flux concentrators 110 arranged in the second direction D2. In the illustration of FIG. 1B, the sensing elements 120b are located below the two sides of the magnetic flux concentrators 110 arranged in the second direction D2. In this embodiment, a portion of the sensing elements 120 (e.g. a sensing element 120c) are disposed on a side of the magnetic flux concentrators 110 in a third direction D3 (parallel to z direction). In the illustration of FIG. 1B, the sensing elements 120c are disposed just under the magnetic flux concentrators 110. In addition, in this embodiment, the first direction D1 is substantially perpendicular to the second direction D2, and the third direction D3 is substantially perpendicular to the first direction D1 and the second direction D2.

In this embodiment, the sensing elements 120 are giant magnetoresistance (GMR) sensors, tunneling magnetoresistance (TMR) sensors, or a combination thereof. However, in other embodiments, the sensing elements 120 may be GMR sensors, TMR sensors, flux gates, magneto-impedance sensors, anisotropic magnetoresistance (AMR) sensors, or a combination thereof. In addition, in this embodiment, sensing directions S of the sensing element 120 are substantially the same. For example, the sensing directions S of the sensing elements 120 are substantially parallel to the second direction D2.

In this embodiment, the magnetic field sensing module 110 further includes a substrate 130 and an insulating layer 140. Also, the sensing elements 120 are disposed on the substrate 130, the insulating layer 140 covers the sensing elements 120, and the magnetic flux concentrators 110 are disposed on the insulating layer 140.

Figure 2A:
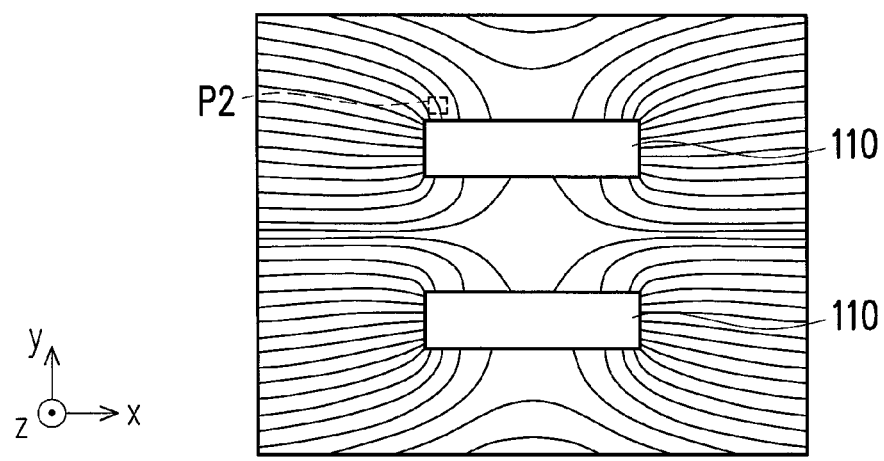
FIGS. 2A, 2B, and 2C are respectively simulated views illustrating that magnetic lines of an external magnetic field are converted by magnetic flux concentrators when the external magnetic field along x direction, y direction, and z direction is applied to the magnetic field sensing module shown in FIGS. 1A to 1C.
Figure 2B:
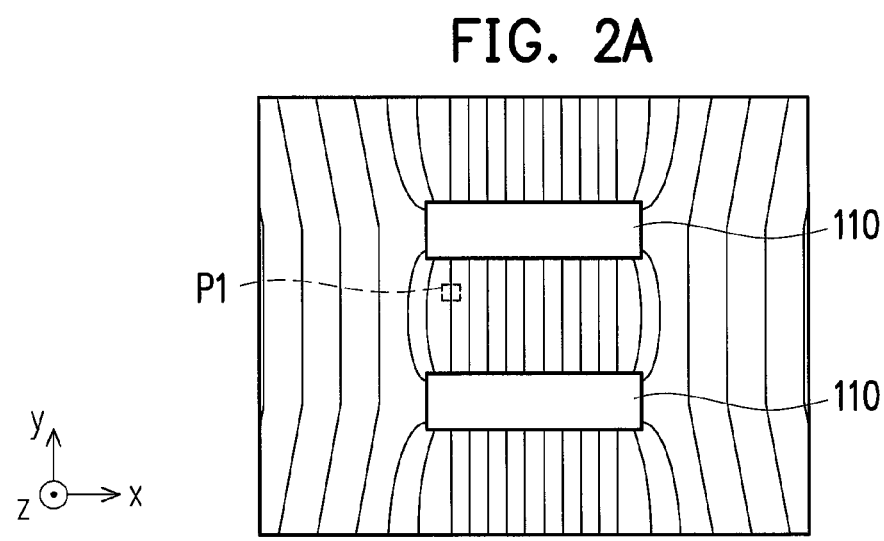
Figure 2C:
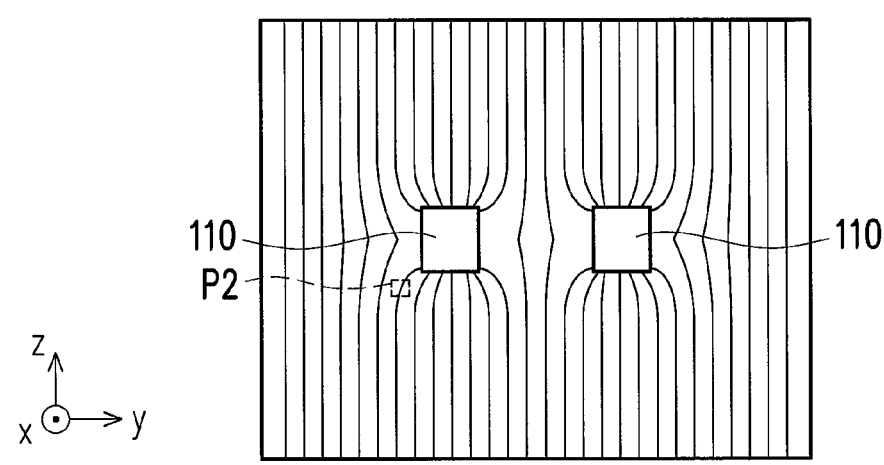

FIGS. 2A, 2B, and 2C are respectively simulated views illustrating that magnetic lines of an external magnetic field are converted by magnetic flux concentrators when the external magnetic field along x direction, y direction, and z direction is applied to the magnetic field sensing module shown in FIGS. 1A to 1C. Referring to FIG. 2A, when an external magnetic field along x direction is applied, a magnetic field at a position P2 at which the sensing element 120b is located is converted into a magnetic field having a component in y direction (i.e. parallel to the second direction D2) due to functioning of the magnetic flux concentrators 110. Therefore, the magnetic field sensing module 100 is allowed to sense a magnitude of a magnetic field in y direction by using the sensing element 120b, so as to determine a magnitude of the external magnetic field in x direction. Referring to FIG. 2B, when an external magnetic field along y direction is applied, a magnetic field direction at a position P1 at which the sensing element 120a is located is maintained to be substantially parallel to y direction (i.e. parallel to the second direction D2) due to functioning of the magnetic flux concentrators 110. Therefore, the magnetic field sensing module 100 is allowed to sense a magnitude of a magnetic field in y direction by using the sensing element 120a, so as to determine a magnitude of the external magnetic field in y direction. Referring to FIG. 2C, when an external magnetic field along z direction is applied, an external magnetic field direction at the position P2 at which the sensing element 120b is located is converted to a magnetic field having a y component due to functioning of the magnetic flux concentrators 110. Therefore, the magnetic field sensing module 100 is allowed to sense a magnitude of the magnetic field of the y component in y direction by using the sensing element 120b, so as to determine a magnitude of the external magnetic field in z direction.

Figure 3A:
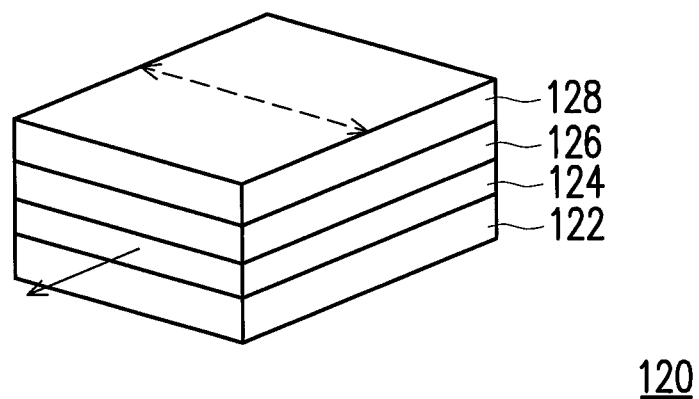
FIG. 3A is a schematic perspective view of a multi-film structure of sensing elements of FIG. 1A.
Figure 3B:
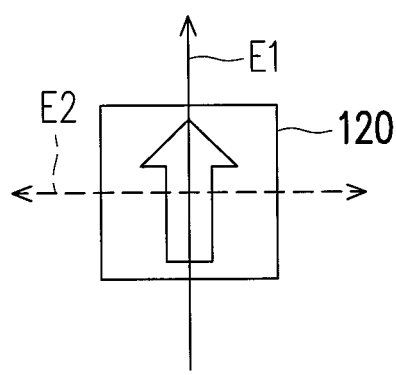
FIG. 3B illustrates a pinning direction and an easy axis of magnetization of a free layer of the sensing elements of FIG. 3A.
Figure 3C:
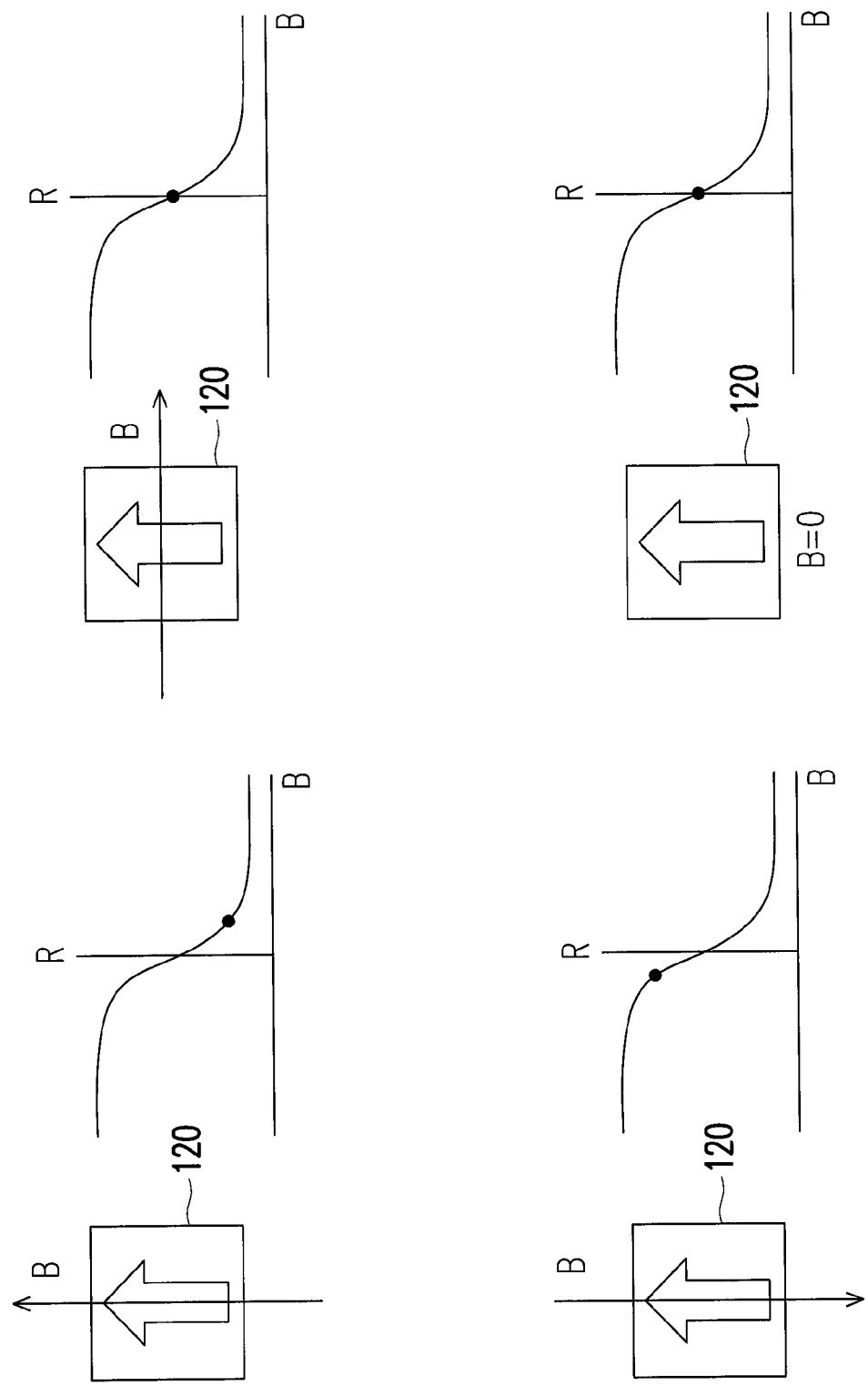
FIG. 3C illustrates variation of resistances of the sensing elements of FIG. 3A with the external magnetic field in different directions functioning and without the external magnetic field.

FIG. 3A is a schematic perspective view of a multi-film structure of the sensing elements of FIG. 1A, FIG. 3B illustrates a pinning direction and an easy axis of magnetization of a free layer of the sensing elements of FIG. 3A, and FIG. 3C illustrates variation of resistances of the sensing elements of FIG. 3A with the external magnetic field in different directions functioning and without the external magnetic field. Referring to FIGS. 3A to 3C, in this embodiment, the sensing element 120 includes a pinning layer 122, a pinned layer 124, a spacer layer 126, and a free layer 128. The pinning layer 122 fixes a magnetization direction of the pinned layer 124, which is a pinning direction E1. A direction of an easy axis of magnetization E2 of the free layer 128 may be substantially perpendicular to the pinning direction E1. When the sensing element 120 is a GMR sensor, a material of the spacer layer 126 is a non-magnetic metal. In addition, when the sensing element 120 is a TMR sensor, the material of the spacer layer 126 is an insulating material.

Curves in FIG. 3C illustrate variation of a resistance R of the sensing element 120 with respect to an external magnetic field B. As shown in an upper left graph of FIG. 3C, when the sensing element 120 is applied with the external magnetic B in the same direction of the pinning direction, the resistance R decreases, as indicated by a numerical value of the resistance R to which a black round dot in the curve corresponds. In addition, the pinning direction is the sensing direction S of the sensing element 120. As shown in a lower left graph of FIG. 3C, when the sensing element 120 is applied with the external magnetic field B in a direction opposite to the pinning direction, the resistance R increases, as indicated by the numerical value of the resistance R to which the black round dot in the curve corresponds. As shown in an upper right graph of FIG. 3C, when the sensing element 120 is applied with the external magnetic field B in a direction perpendicular to the pining direction, the resistance R remains the same, as indicated by the numerical value of the resistance R to which the black round dot in the curve corresponds. Also, as shown in a lower right graph of FIG. 3C, when the sensing element 120 is not applied with a magnetic field, the resistance R remains the same, as indicated by the numerical value of the resistance R to which the black round dot in the curve corresponds.

Figure 4A:
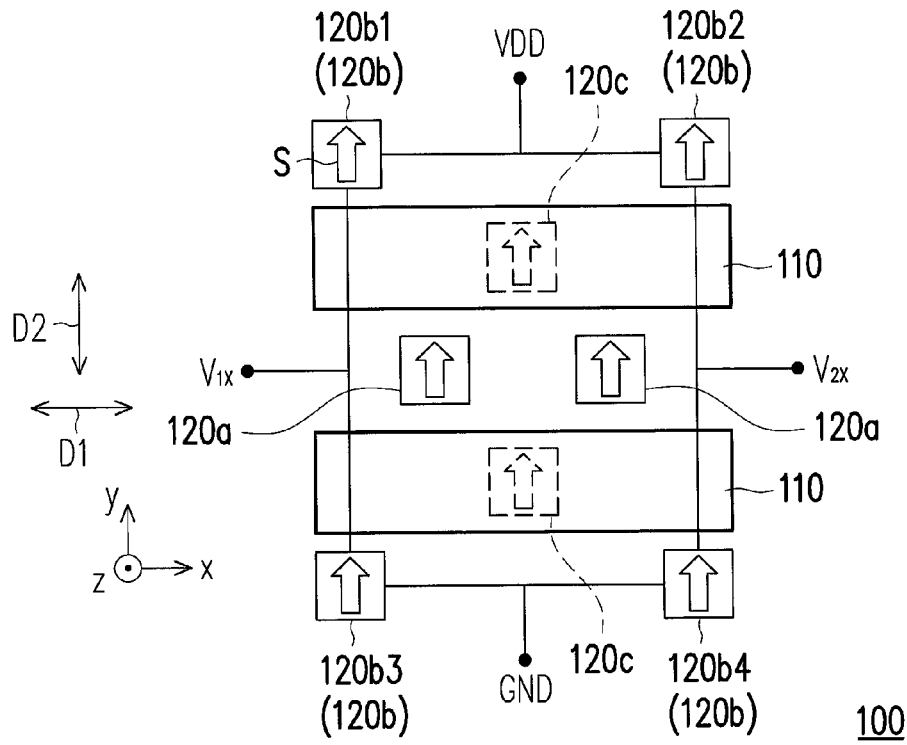
FIG. 4A illustrates a circuit structure of the magnetic field sensing module of FIG. 1A when sensing a magnetic field parallel to x direction.
Figure 4B:
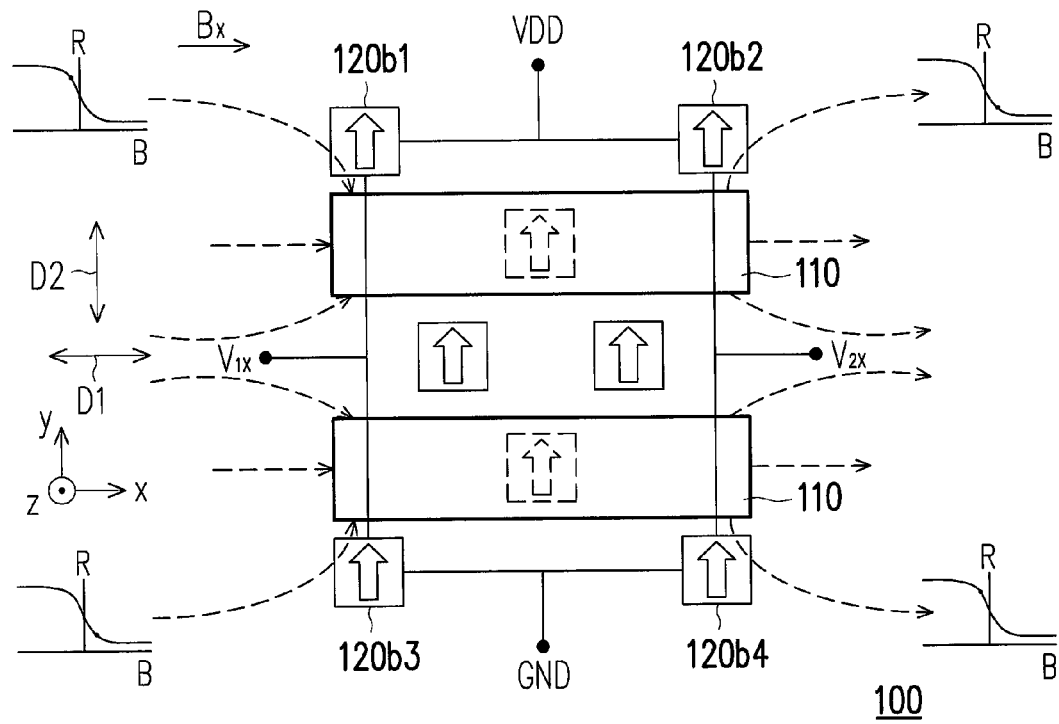
FIG. 4B illustrates variation of resistances of the sensing elements when an external magnetic field parallel to x direction is applied to the circuit structure of FIG. 4A.
Figure 4C:
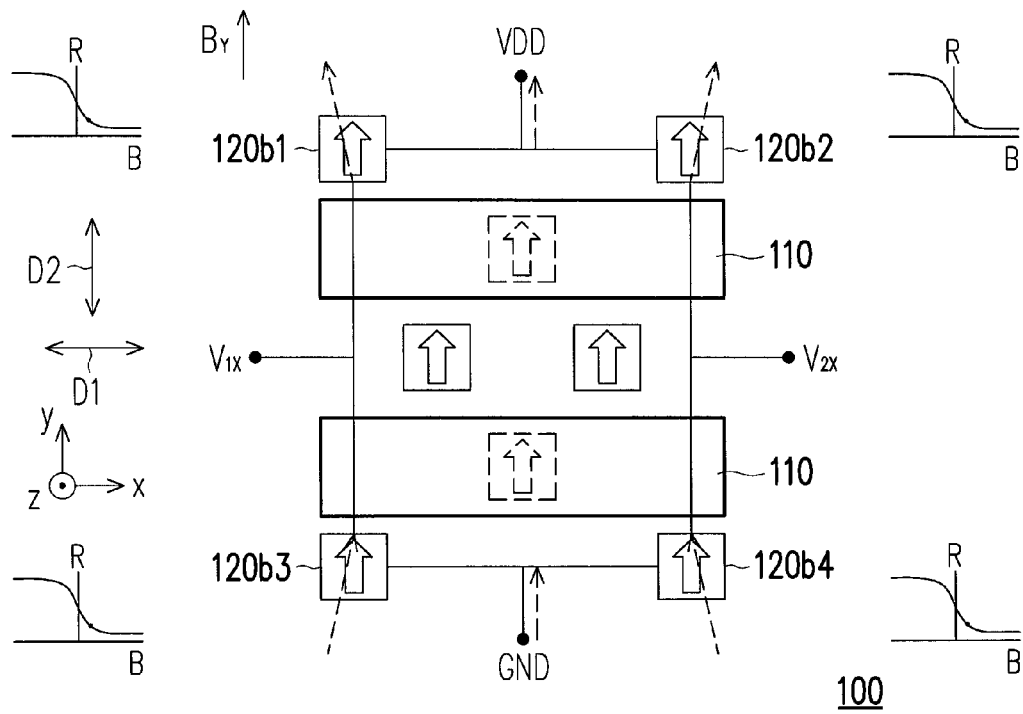
FIG. 4C illustrates variation of resistances of the sensing elements when an external magnetic field parallel to y direction is applied to the circuit structure of FIG. 4A.
Figure 4D:
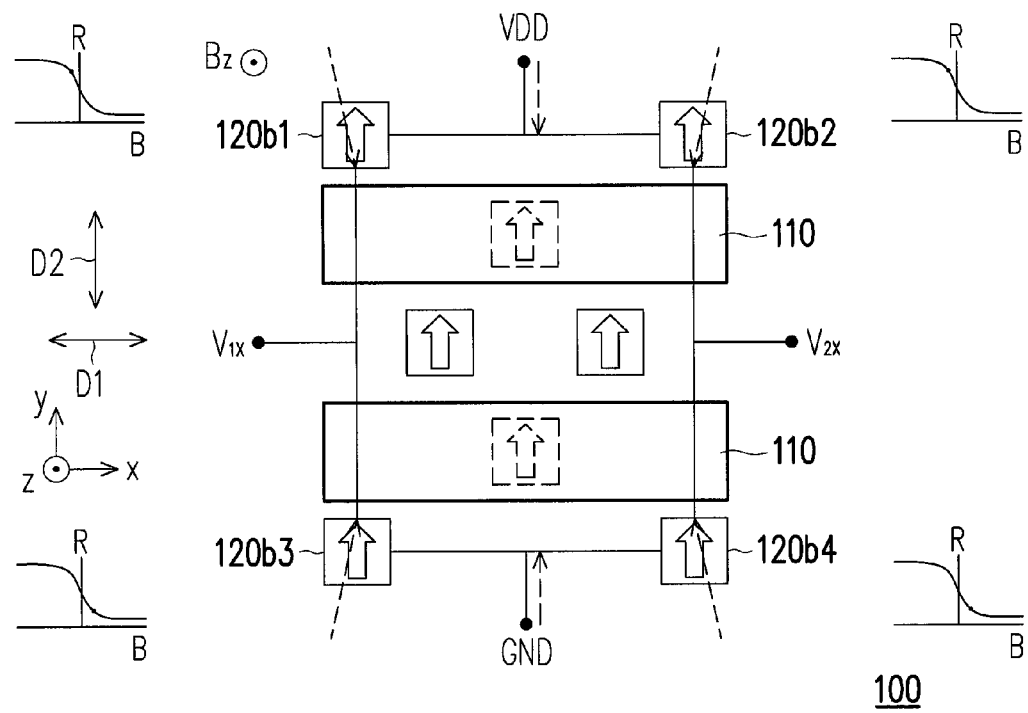
FIG. 4D illustrates variation of resistances of the sensing elements when an external magnetic field parallel to z direction is applied to the circuit structure of FIG. 4A.

FIG. 4A illustrates a circuit structure of the magnetic field sensing module of FIG. 1A when sensing a magnetic field parallel to x direction. FIG. 4B illustrates variation of resistances of the sensing elements when an external magnetic field parallel to x direction is applied to the circuit structure of FIG. 4A. FIG. 4C illustrates variation of resistances of the sensing elements when an external magnetic field parallel to y direction is applied to the circuit structure of FIG. 4A. FIG. 4D illustrates variation of resistances of the sensing elements when an external magnetic field parallel to z direction is applied to the circuit structure of FIG. 4A. Referring to FIG. 4A to 4D, a portion of the sensing elements 120b disposed at the positions corresponding to the two sides of the magnetic flux concentrators 110 arranged in the second direction D2 (i.e. parallel to y direction) are coupled to form a first Wheatstone bridge for sensing a component BX of an external magnetic field in the first direction D1 (i.e. parallel to x direction).

Specifically speaking, referring to FIG. 4B, when the external magnetic field only has the component BX, there is a component in −y direction in a magnetic field where a sensing element 120b1 is located (i.e. opposite to the sensing direction S of the sensing element 120b1) due to functioning of the magnetic flux concentrators 110. Therefore, a resistance of the sensing element 120b1 increases. Besides, there is a component in +y direction in a magnetic field where a sensing element 120b2 is located (i.e. the same as the sensing direction S of the sensing element 120b2, so a resistance of the sensing element 120b2 decreases. In the same light, there is a component in +y direction in a magnetic field where a sensing element 120b3 is located (i.e. the same as the sensing direction S of the sensing element 120b3), so a resistance of the sensing element 120b3 decreases. Besides, there is a component in −y direction in a magnetic field where a sensing element 120b4 is located (i.e. opposite to the sensing direction S of the sensing element 120b4), so a resistance of the sensing element 120b4 increases. In the first Wheatstone bridge, a voltage supply terminal VDD is coupled between the sensing elements 120b1 and 120b2, and a ground terminal GND is coupled between the sensing elements 120b3 and 120b4. In addition, a voltage output terminal $V_{1X}$ is coupled between the sensing elements 120b1 and 120b3, and a voltage output terminal $V_{2X}$ is coupled between the sensing elements 120b2 and 120b4. Since a resistance between the voltage supply terminal VDD and the voltage output terminal $V_{1X}$ (i.e. the resistance of the sensing element 120b1) is higher than a resistance between the voltage supply terminal VDD and the voltage output terminal $V_{2X}$ (i.e. the resistance of the sensing element 120b2), while a resistance between the voltage output terminal $V_{1X}$ and the ground terminal GND (i.e. the resistance of the sensing element 120b3) is lower than a resistance between the voltage output terminal Vex and the ground terminal GND (i.e. the resistance of the sensing element 120b4), a voltage value of the voltage output terminal $V_{1X}$ is lower than a voltage value of the voltage output terminal $V_{2X}$. In this way, a magnitude and sign (e.g. positive or negative) of the component $B_X$ of the external magnetic field in x direction may be determined by measuring a magnitude and sign of a voltage difference signal between the voltage output terminals $V_{1X}$ and $V_{2X}$.

Then, referring to FIG. 4C, when the external magnetic field has only a component By, the magnetic fields at the sensing elements 120b1, 120b2, 120b3, and 120b4 all have a component in +y direction due to functioning of the magnetic flux concentrators 110. Therefore, the resistances of the sensing elements 120b1, 120b2, 120b3, and 120b4 decrease. Here, since the four sensing elements 120b in the first Wheatstone bridge have the same resistances, the voltage value of the voltage output terminal $V_{1X}$ is substantially the same as the voltage value of the voltage output terminal $V_{2X}$. In this way, when the magnitude and sign of the voltage difference signal between the voltage output terminals $V_{1X}$ and $V_{2X}$ are measured, a result of measurement is zero. Namely, the component By of the external magnetic field is not sensed by a framework of the first Wheatstone bridge.

Then, referring to FIG. 4D, when the external magnetic field only has a component $B_Z$, the magnetic fields at the sensing elements 120b1 and 120b2 have a component in −y direction due to functioning of the magnetic flux concentrators 110, so the resistances of the sensing elements 120b1 and 120b2 increase. In addition, the magnetic fields at the sensing elements 120b3 and 120b4 have a component in +y direction. Therefore, the resistances of the sensing elements 120b3 and 120b4 decrease. A resistance proportion between the sensing elements 120b1 and 120b3 is substantially identical to a resistance proportion between the sensing elements 120b2 and 120b4, the voltage value of the voltage output terminal $V_{1X}$ is thus substantially equal to the voltage value of the voltage output terminal $V_{2X}$. In this way, when the magnitude and sign of the voltage difference signal between the voltage output terminal $V_{1X}$ and the voltage output terminal $V_{2X}$ are measured, the result of measurement is zero. Namely, the component $B_Z$ of the external magnetic field is not measured by the framework of the first Wheatstone bridge.

Figure 5A:
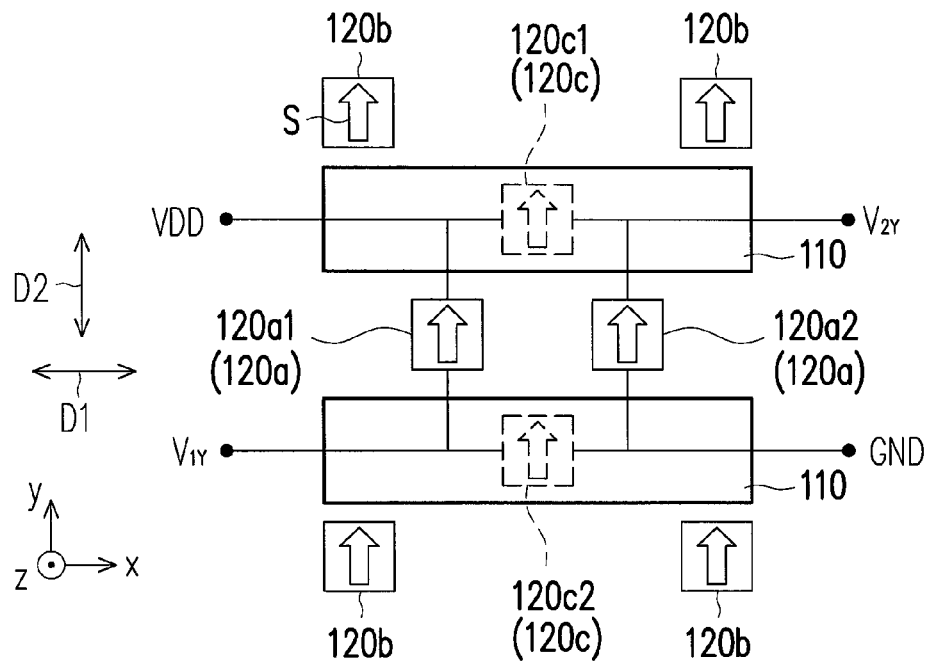
FIG. 5A illustrates a circuit structure of the magnetic field sensing module of FIG. 1A when sensing a magnetic field parallel to y direction.
Figure 5B:
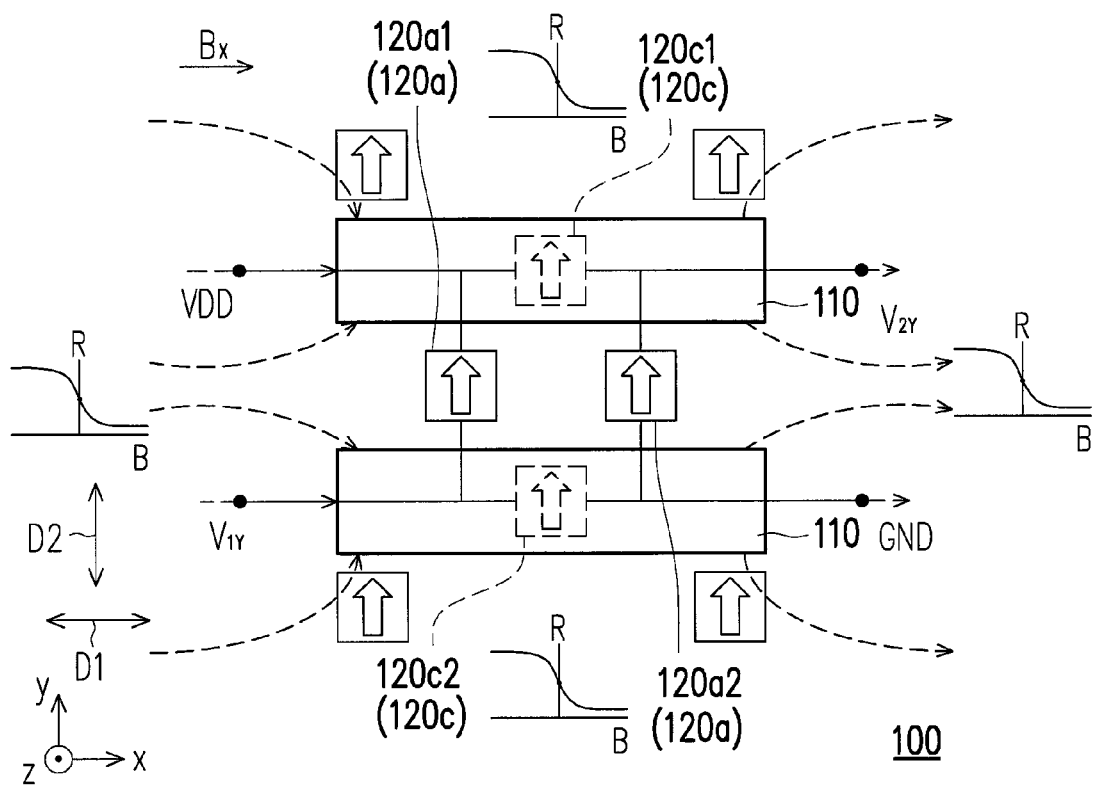
FIG. 5B illustrates variation of resistances of the sensing elements when an external magnetic field parallel to x direction is applied to the circuit structure of FIG. 5A.
Figure 5C:
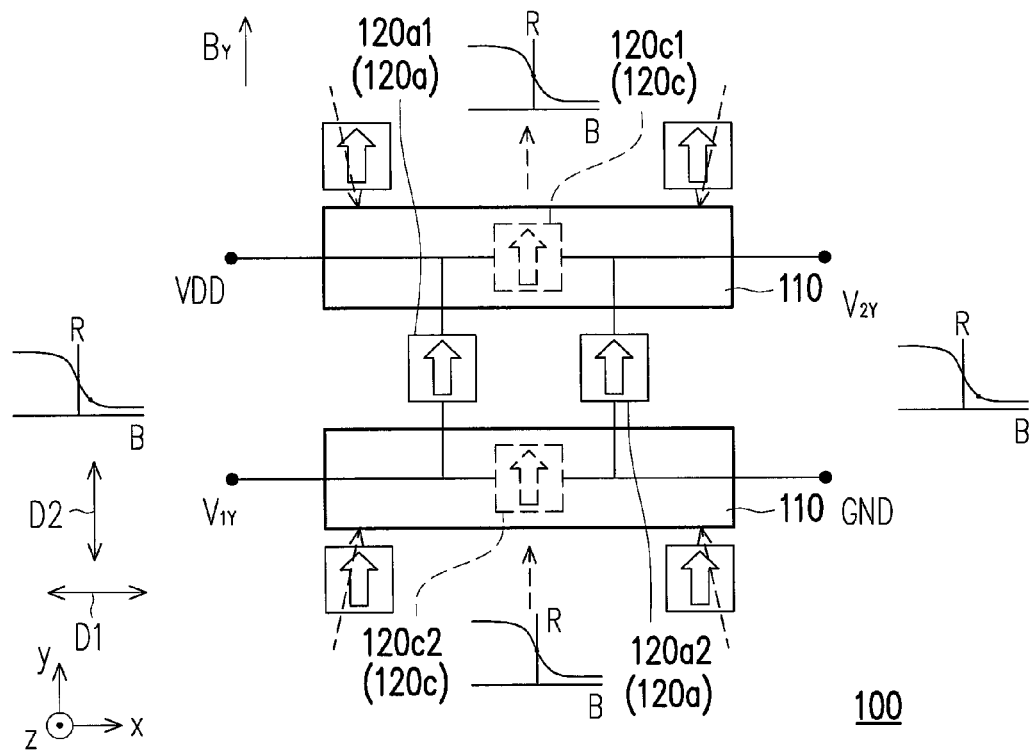
FIG. 5C illustrates variation of resistances of the sensing elements when an external magnetic field parallel to y direction is applied to the circuit structure of FIG. 5A.
Figure 5D:
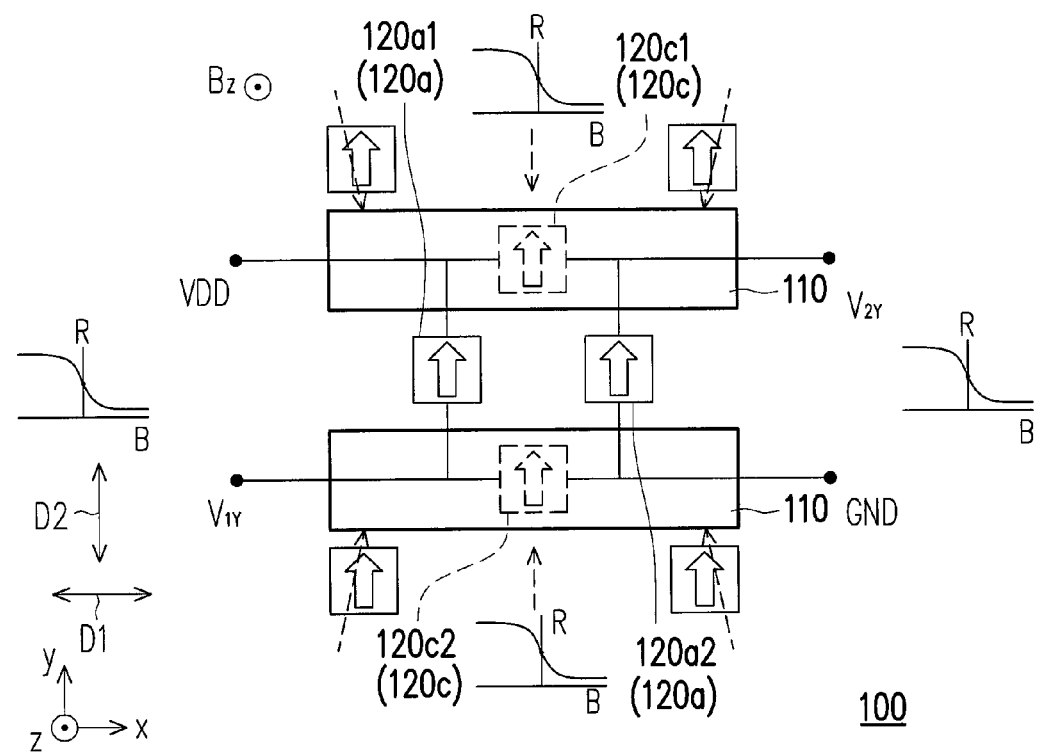
FIG. 5D illustrates variation of resistances of the sensing elements when an external magnetic field parallel to z direction is applied to the circuit structure of FIG. 5A.

FIG. 5A illustrates a circuit structure of the magnetic field sensing module of FIG. 1A when sensing a magnetic field parallel to y direction. FIG. 5B illustrates variation of resistances of the sensing elements when an external magnetic field parallel to x direction is applied to the circuit structure of FIG. 5A. FIG. 5C illustrates variation of resistances of the sensing elements when an external magnetic field parallel to y direction is applied to the circuit structure of FIG. 5A. FIG. 5D illustrates variation of resistances of the sensing elements when an external magnetic field parallel to z direction is applied to the circuit structure of FIG. 5A. Referring to FIGS. 5A to 5D, in this embodiment, the sensing element 120a disposed at the position corresponding to the position between the magnetic flux concentrators 110 and the sensing elements 120c disposed on the one side of the magnetic flux concentrators 110 in the third direction D3 are coupled to form a second Wheatstone bridge, so as to sense the component By of the external magnetic field in the second direction D2 (i.e. parallel to y direction).

Specifically speaking, referring to FIG. 5B, when the external magnetic field only has the component $B_X$, due to functioning of the magnetic flux concentrators 110, a net y component of magnetic fields at sensing elements 120a1 and 120a2 is zero, so resistances of the sensing elements 120a1 and 120a2 remain the same. In addition, since sensing elements 120c1 and 120c2 are disposed under the magnetic flux concentrators 110, the sensing elements 120c1 and 120c2 are not influenced by the component BX of the external magnetic field due to a ferromagnetic shielding effect. Thus, resistances of the sensing elements 120c1 and 120c2 remain unchanged. In the second Wheatstone bridge, the voltage supply terminal VDD is coupled between the sensing element 120a1 and the sensing element 120c1, and the ground terminal GND is coupled between the sensing element 120a2 and the sensing element 120c2. In addition, a voltage output terminal $V_{1Y}$ is coupled between the sensing element 120a1 and the sensing element 120c2, and a voltage output terminal $V_{2Y}$ is coupled between the sensing element 120a2 and the sensing element 120c1. Since there is no variation for the sensing elements 120a1, 120a2, 120c1, and 120c2, a voltage value of the voltage output terminal $V_{1Y}$ is substantially the same as a voltage value of the voltage output terminal $V_{2Y}$. In this way, a voltage difference signal sensed between the voltage output terminal $V_{1Y}$ and the voltage output terminal $V_{2Y}$ is zero. Namely, the component $B_X$ of the external magnetic field in x direction does not influence a framework of the Wheatstone bridge.

Then, referring to FIG. 5C, when the external magnetic field has only the component $B_Y$, the magnetic fields at the sensing elements 120a1 and 120a2 have a component in +y direction due to functioning of the magnetic flux concentrators 110. Therefore, the resistances of the sensing elements 120a1 and 120a2 decrease. Also, since the sensing elements 120c1 and 120c2 are disposed under the magnetic flux concentrators 110, the sensing elements 120c1 and 120c2 are not influenced by the component $B_Y$ of the external magnetic field due to the ferromagnetic shielding effect. Thus, the resistances of the sensing elements 120c1 and 120c2 remain unchanged. In this way, since the resistance of the sensing element 120a1 is lower than the resistance of the sensing element 120c1, while the resistance of the sensing elements 120c2 is higher than the resistance of the sensing element 120a2 in the second Wheatstone bridge, the voltage value of the voltage output terminal $V_{1Y}$ is higher than the voltage value of the voltage output terminal $V_{2Y}$. Accordingly, a magnitude and sign of the component $B_Y$ of the external magnetic field in y direction may be determined by measuring a magnitude and sign of the voltage difference signal between the voltage output terminal $V_{1Y}$ and the voltage output terminal $V_{2Y}$.

Referring to FIG. 5D, when the external magnetic field has only the component $B_Z$, due to functioning of the magnetic flux concentrators 110, the y-component of magnetic field bended from z-axis external field are actually cancelled out at positions between the two flux concentrators 110, i.e. the positions of the sensing elements 120a1 and 120a2. Therefore, the external magnetic field do not change the resistances of the sensing elements 120a1 and 120a2 at these positions. Besides, magnetic field directions at the sensing elements 120c1 and 120c2 are also substantially parallel to z direction (as shown in FIG. 2C). The magnetic fields in this direction do not change the resistances of the sensing elements 120c1 and 120c2. Here, since the resistances of all of the sensing elements 120a1, 120a2, 120c1, and 120c2 in the second Wheatstone bridge are substantially the same, the voltage value of the voltage output terminal $V_{1Y}$ is substantially the same as the voltage value of the voltage output terminal $V_{2Y}$. In this way, when the magnitude and sign of the voltage difference signal between the voltage output terminals $V_{1Y}$ and $V_{2Y}$ are measured, the result of measurement is zero. Namely, the component $B_Z$ of the external magnetic field is not measured by the framework of the second Wheatstone bridge.

Figure 6A:
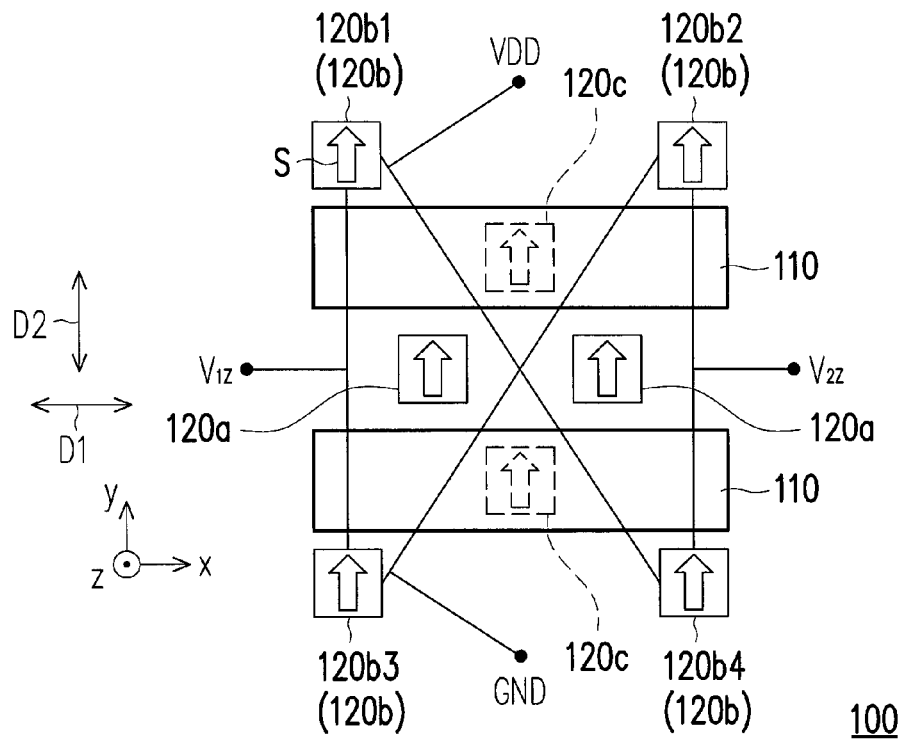
FIG. 6A illustrates a circuit structure of the magnetic field sensing module of FIG. 1A when sensing a magnetic field parallel to z direction.
Figure 6B:
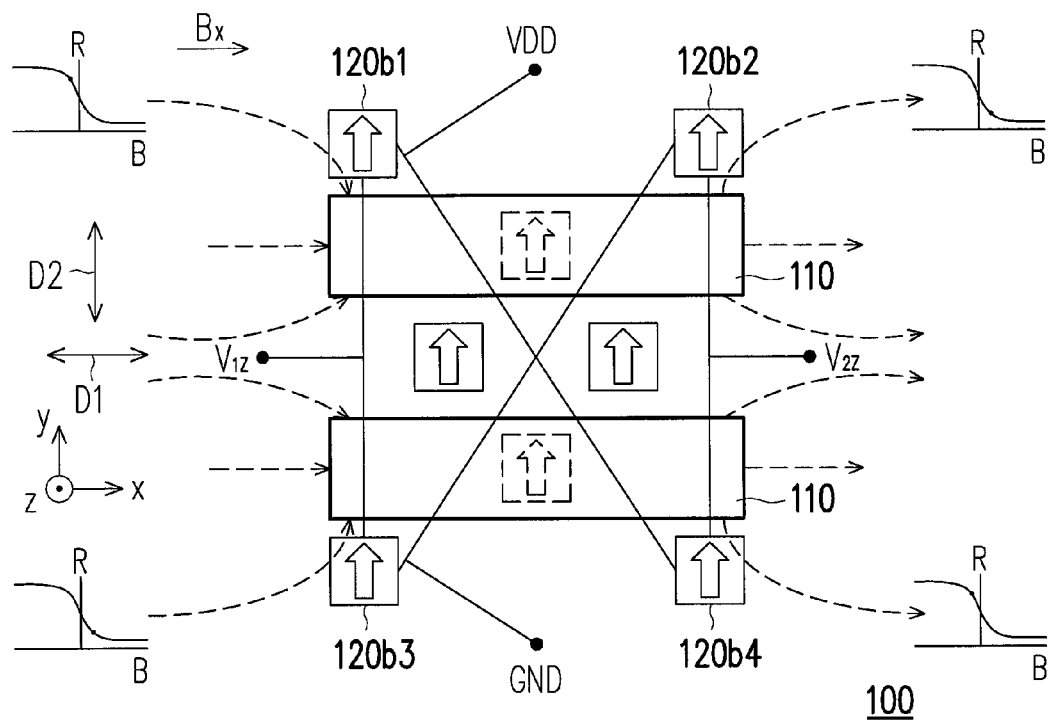
FIG. 6B illustrates variation of resistances of the sensing elements when an external magnetic field parallel to x direction is applied to the circuit structure of FIG. 6A.
Figure 6C:
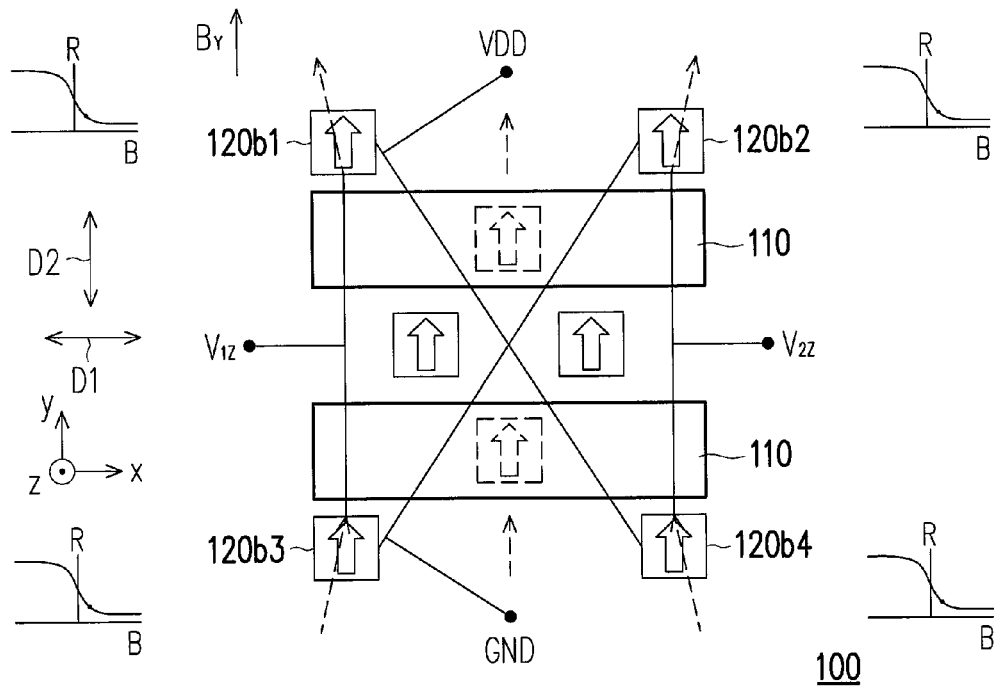
FIG. 6C illustrates variation of resistances of the sensing elements when an external magnetic field parallel to y direction is applied to the circuit structure of FIG. 6A.
Figure 6D:
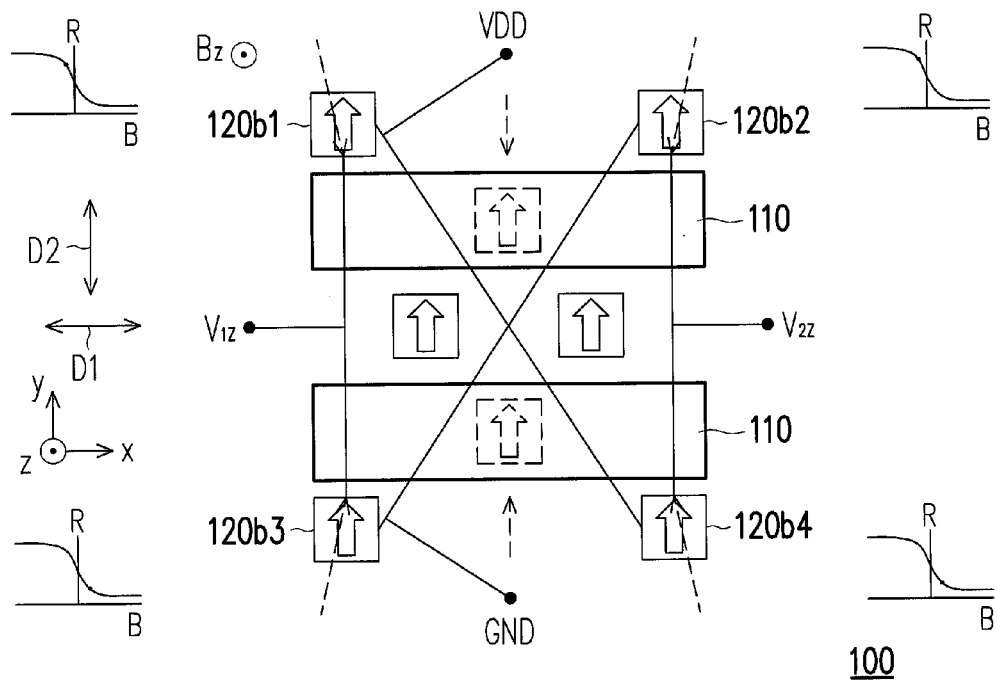
FIG. 6D illustrates variation of resistances of the sensing elements when an external magnetic field parallel to z direction is applied to the circuit structure of FIG. 6A.

FIG. 6A illustrates a circuit structure of the magnetic field sensing module of FIG. 1A when sensing a magnetic field parallel to z direction. FIG. 6B illustrates variation of resistances of the sensing elements when an external magnetic field parallel to x direction is applied to the circuit structure of FIG. 6A. FIG. 6C illustrates variation of resistances of the sensing elements when an external magnetic field parallel to y direction is applied to the circuit structure of FIG. 6A. FIG. 6D illustrates variation of resistances of the sensing elements when an external magnetic field parallel to z direction is applied to the circuit structure of FIG. 6A. Referring to FIGS. 6A and 6D, the sensing elements 120b disposed at the positions corresponding to the two sides of the magnetic flux concentrators 110 arranged in the second direction D2 are coupled to form the first Wheatstone bridge (the First Wheatstone bridge shown in FIG. 4A) through a first conductive path, and are coupled to form a third Wheatstone bridge (the Wheatstone bridge shown in FIG. 6A) through a second conductive path. The first Wheatstone bridge is configured to sense the component $B_X$ of the external magnetic field in the first direction D1, while the third Wheatstone bridge is configured to sense the component $B_Z$ of the external magnetic field in the third direction (i.e. z direction). In addition, the sensing elements 120b are coupled on the first conductive path in a different sequence than a sequence that the sensing elements 120b are coupled on the second conductive path, as shown in the crossing second conductive path illustrated in FIG. 6A that differs from the non-crossing first conductive path illustrated in FIG. 4A.

Specifically, referring to FIG. 6B, when the external magnetic field only has the component $B_X$, there is a component in -y direction in the magnetic field at the sensing element 120b1 due to functioning of the magnetic flux concentrators 110. Therefore, the resistance of the sensing element 120b1 increases. In addition, the magnetic field at the sensing element 120b2 has a component in +y direction. Therefore, the resistance of the sensing element 120b2 decreases. In the same light, the magnetic field at the sensing element 120b3 has a component in +y direction. Therefore, the resistance of the sensing element 120b3 decreases. Besides, the magnetic field at the sensing element 120b4 has a component in -y direction. Therefore, the resistance of the sensing element 120b4 increases. In the third Wheatstone bridge, the voltage supply terminal VDD is coupled between the sensing element 120b1 and the sensing element 120b4, and the ground terminal GND is coupled between the sensing element 120b2 and the sensing element 120b3. In addition, a voltage output terminal $V_{1Z}$ is coupled between the sensing element 120b1 and the sensing element 120b3, and a voltage output terminal $V_{2Z}$ is coupled between the sensing element 120b2 and the sensing element 120b4. Since a resistance between the voltage supply terminal VDD and the voltage output terminal $V_{1Z}$ (i.e. the resistance of the sensing element 120b1) and a resistance between the voltage supply terminal VDD and the voltage output terminal $V_{2Z}$ (i.e. the resistance of the sensing element 120b4) are increased and substantially the same with respect to each other, and a resistance between the voltage output terminal $V_{1Z}$ and the ground terminal GND (i.e. the resistance of the sensing element 120b3) and a resistance between the voltage output terminal $V_{2Z}$ and the ground terminal GND (i.e. the resistance of the sensing element 120b2) are decreased and substantially the same with respect to each other, a voltage value of the voltage output terminal $V_{1Z}$ is substantially equivalent to a voltage value of the voltage output terminal $V_{2Z}$. In this way, when a magnitude and sign of a voltage difference signal between the voltage output terminal $V_{1Z}$ and the voltage output terminal $V_{2Z}$ are measured, a voltage difference is zero. Namely, the component $B_X$ of the external magnetic field is not measured by a framework of the third Wheatstone bridge.

Then, referring to FIG. 6C, when the external magnetic field has only the component $B_Y$, the magnetic fields at the sensing elements 120b1, 120b2, 120b3, and 120b4 all have a component in +y direction due to functioning of the magnetic flux concentrators 110. Therefore, the resistances of the sensing elements 120b1, 120b2, 120b3, and 120b4 decrease. Here, since the four sensing elements 120b in the third Wheatstone bridge have the same resistances, the voltage value of the voltage output terminal $V_{1Z}$ is substantially the same as the voltage value of the voltage output terminal $V_{2Z}$. In this way, when the magnitude and sign of the voltage difference signal between the voltage output terminal $V_{1Z}$ and the voltage output terminal $V_{2Z}$ are measured, a result of measurement is zero. Namely, the component $B_Y$ of the external magnetic field is not sensed by the framework of the third Wheatstone bridge.

Then, referring to FIG. 6D, when the external magnetic field only has the component $B_Z$, the magnetic fields at the sensing elements 120b1 and 120b2 have a component in −y direction due to functioning of the magnetic flux concentrators 110, so the resistances of the sensing elements 120b1 and 120b2 increase. In addition, the magnetic fields at the sensing elements 120b3 and 120b4 have a component in +y direction. Therefore, the resistances of the sensing elements 120b3 and 120b4 decrease. Here, since the resistance between the voltage supply terminal VDD and the voltage output terminal $V_{1Z}$ (i.e. the resistance of the sensing element 120b1) is higher than the resistance between the voltage supply terminal VDD and the voltage output terminal $V_{2Z}$ (i.e. the resistance of the sensing element 120b4), while the resistance between the voltage output terminal $V_{1Z}$ and the ground terminal GND (i.e. the resistance of the sensing element 120b3) is lower than the resistance between the voltage output terminal $V_{2Z}$ and the ground terminal GND (i.e. the resistance of the sensing element 120b2), the voltage value of the voltage output terminal $V_{1Z}$ is lower than the voltage value of the voltage output terminal $V_{2Z}$. In this way, a magnitude and sign of the component BZ of the external magnetic field in z direction may be determined by measuring the magnitude and sign of the voltage difference signal between the voltage output terminal $V_{1Z}$ and the voltage output terminal $V_{2Z}$.

Based on the analyses on FIGS. 4A to 6D together, it can be known that since the framework of the first Wheatstone bridge shown in FIGS. 4A to 4D only detects the magnetic field in the first direction D1 without being influenced by the magnetic fields in the second direction D2 and the third direction D3, since the framework of the second Wheatstone bridge shown in FIGS. 5A to 5D only detects the magnetic field in the second direction D2 without being influenced by the magnetic fields in the first direction D1 and the third direction D3, and since the framework of the third Wheatstone bridge shown in FIGS. 6A to 6D only detects the magnetic field in the third direction D3 without being influenced by the magnetic fields in the first direction D1 and the second direction D2, therefore the components of the external magnetic field in the first direction D1, the second D2, and the third direction D3 are respectively detected by using the first, second and third Wheatstone bridges no matter the external magnetic field has a component in one or more than one of the first direction D1 to the third direction D3 or has components in the first direction D1 to the third direction D3 at the same time, or the external magnetic field is zero, thereby obtaining a magnitude and direction of the external magnetic field by calculating the vector sum of the components. In other words, the magnetic field sensing module 100 of this embodiment is capable of three-axis magnetic field measurement.

In the magnetic field sensing module 100 of this embodiment, since the magnetic flux concentrators 110 are used to bend the external magnetic field, the sensing directions S of the plurality of sensing elements 120 may be substantially the same. Thus, the magnetic field sensing module 100 achieves multi-axial magnetic field sensing in a relatively simplified framework, thereby reducing manufacture complexity and cost of the magnetic field sensing module 100.

In addition, circuits of the first, second, and third Wheatstone bridge may be formed at three different sub-periods in a cycle time by employing a design of circuit switch, so as to measure the components $B_X$, $B_Y$, and $B_Z$ of the external magnetic field in the first direction D1, the second direction D2, and the third direction D3 respectively at different sub-periods. In this way, the first and third Wheatstone bridges may normally operate even if the first and third Wheatstone bridges share the signal direction magnetic sensors 120b1, 120b2, 120b3, and 120b4, because the first and third Wheatstone bridges are formed at different sub-periods. When the first, second, and third Wheatstone bridges are repetitively and sequentially formed in a plurality of cycle times, the magnetic field sensing module 100 is capable of real-time monitoring variation of the external magnetic field.

In another embodiment, the first and third Wheatstone bridges may not share the sensing elements 120b, and another four sensing elements 120b may be additionally disposed around the sensing elements 120b1, 120b2, 120b3, and 120b4 (not shown in FIGS. 4A to 6D, but other drawings are used to illustrate the concept in the embodiment below). In other words, another portion of the sensing elements 120b disposed in the positions corresponding to the two sides of the magnetic flux concentrators 110 arranged in the second direction D2 are coupled to form the third Wheatstone bridge and are configured to sense the component of the external magnetic field in the third direction D3. Under such circumstance, the first, second, and third Wheatstone bridges may be formed at a plurality of different sub-periods in a cycle time or exist simultaneously.

In addition, in other embodiments, since the sensing elements 120c actually have no response to the external magnetic field, the sensing elements 120c (e.g. the sensing elements 120c1 and 120c2) may be replaced with resistors (e.g. replaced with two resistors). Resistance values of the resistors are substantially the same as an initial value of the resistance of the sensing element 120a of the second Wheatstone bridge when the external magnetic field is absent. In other words, the magnetic field sensing module 100 may include a plurality of resistors, which are coupled with the sensing element 120a disposed at the position corresponding to the position between the magnetic flux concentrators 110 to form the second Wheatstone bridge and configured to measure the component of the external magnetic field in the second direction D2.

Figure 7A:
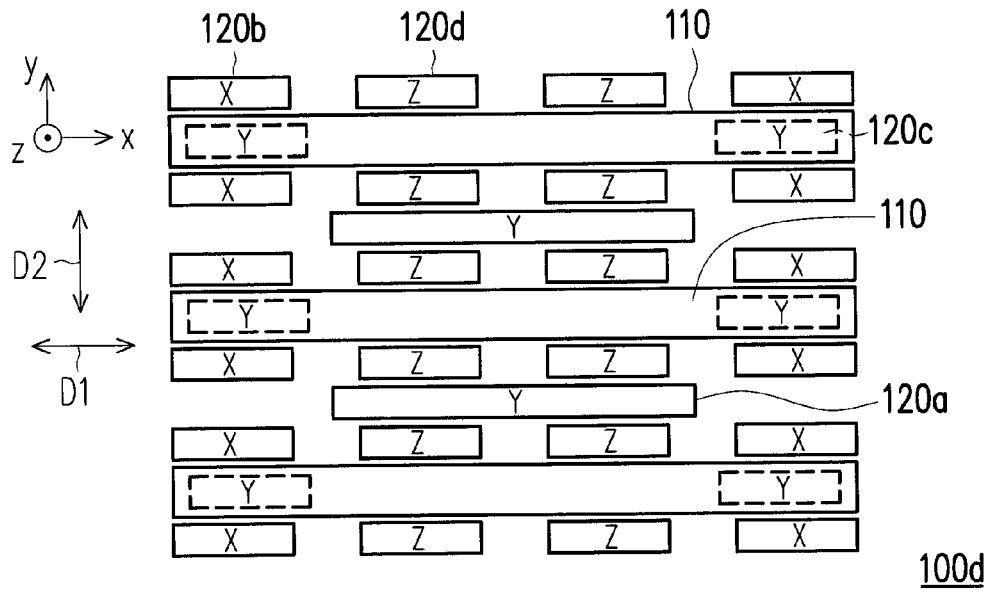
FIG. 7A is a schematic structural top view of a magnetic field sensing module according to another embodiment of the invention.
Figure 7B:
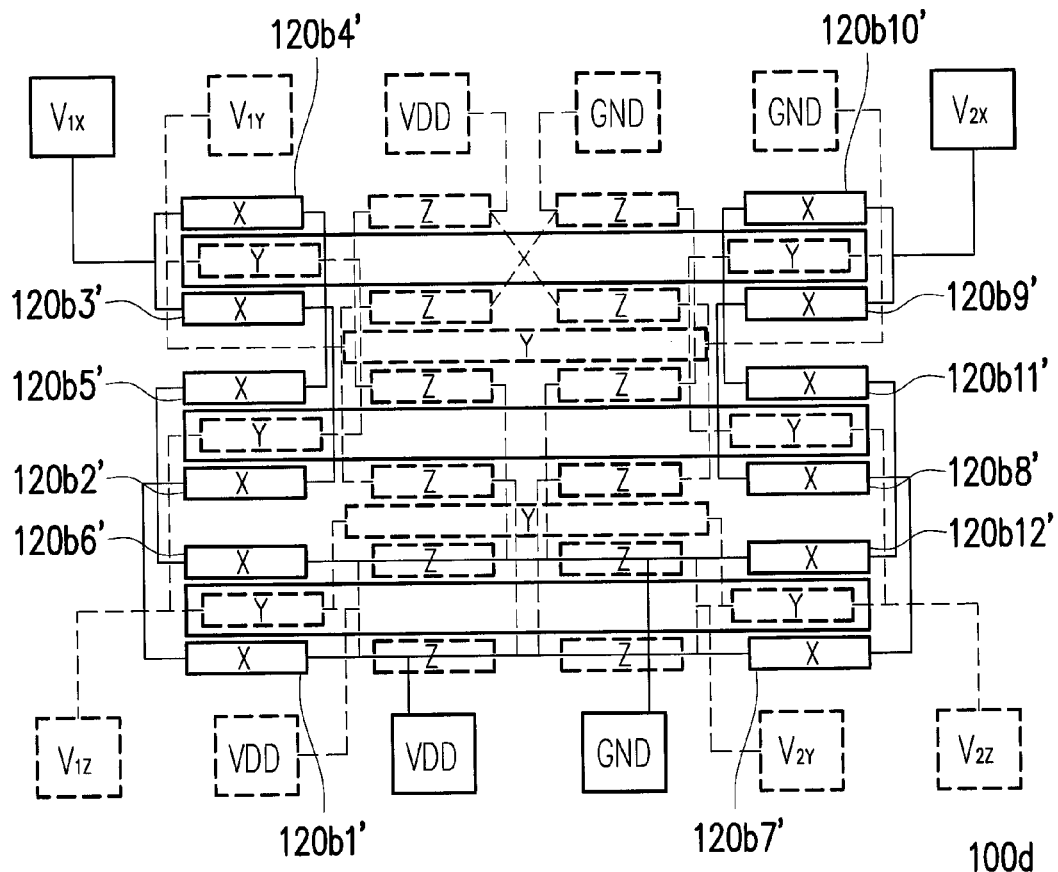
FIG. 7B illustrates a first Wheatstone bridge of the magnetic field sensing module of FIG. 7A for measuring a magnetic field in x direction.
Figure 7C:
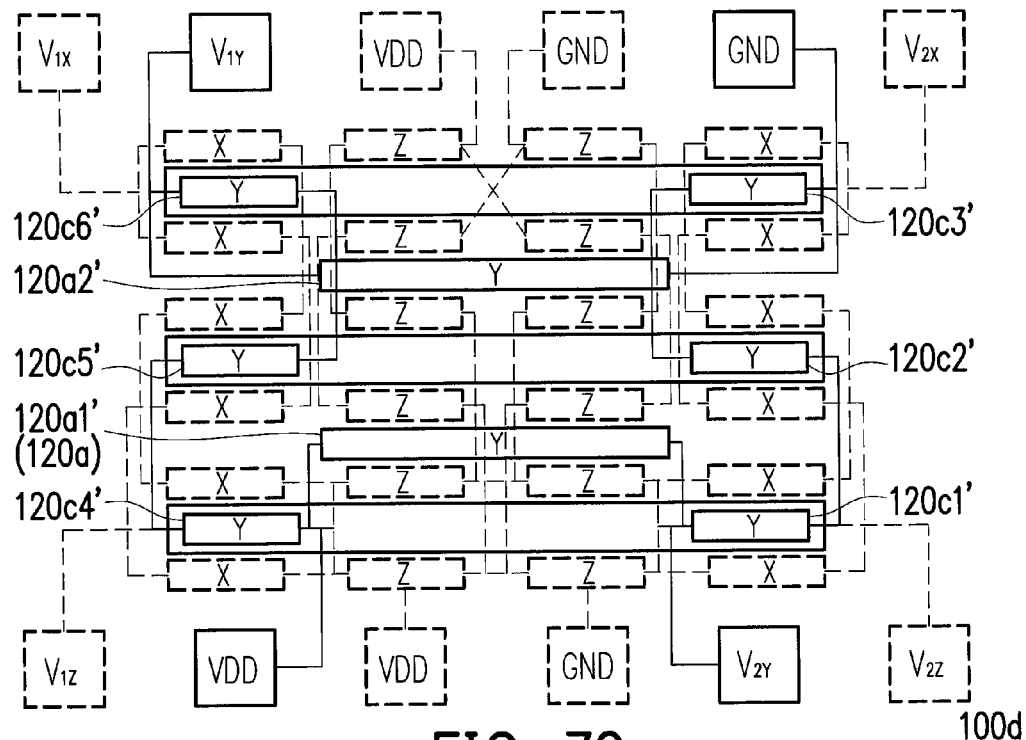
FIG. 7C illustrates a second Wheatstone bridge of the magnetic field sensing module of FIG. 7A for measuring a magnetic field in y direction.
Figure 7D:
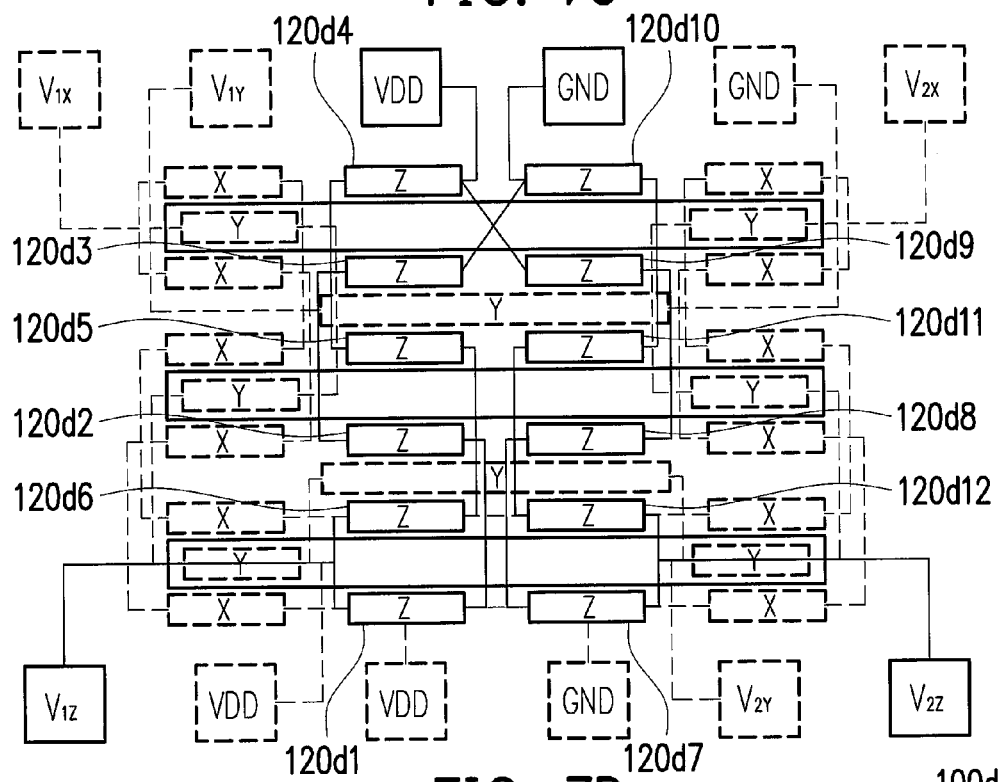
FIG. 7D illustrates a third Wheatstone bridge of the magnetic field sensing module of FIG. 7A for measuring a magnetic field in z direction.

FIG. 7A is a schematic structural top view of a magnetic field sensing module according to another embodiment of the invention, FIG. 7B illustrates the first Wheatstone bridge of the magnetic field sensing module of FIG. 7A for measuring a magnetic field in x direction, FIG. 7C illustrates a second Wheatstone bridge of the magnetic field sensing module of FIG. 7A for measuring a magnetic field in y direction, and FIG. 7D illustrates a third Wheatstone bridge of the magnetic field sensing module of FIG. 7A for measuring a magnetic field in z direction. Referring to FIG. 7A to 7D, a magnetic field sensing module 100d of this embodiment is similar to the magnetic field sensing module shown in FIG. 4A, but differs in numbers of the magnetic flux concentrators 110 and the sensing elements 120. In fact, the invention does not limit the numbers of the magnetic flux concentrators 110 and the sensing elements 120 in a magnetic field sensing module, as long as the sensing elements 120 are disposed at relative positions corresponding to FIG. 4A with respect to the magnetic flux concentrators 110. FIGS. 7A and 7D only serve to provide one of the examples, and the invention is not limited thereto. In FIGS. 7A to 7D, positions of the sensing elements 120b marked with "X" correspond to the positions of the sensing elements 120b in FIG. 4A. Namely, the sensing elements 120b marked with "X" are disposed at the positions at the two sides of the magnetic flux concentrators 110 arranged in the second direction D2. Besides, positions of sensing elements 120d marked with "Z" correspond to the positions of the sensing elements 120b in FIG. 4A. In addition, the sensing elements 120b marked with "X" and the sensing elements 120d marked with "Z" respectively form the first Wheatstone bridge (as shown in FIG. 7B) and the third Wheatstone bridge (as shown in FIG. 7C). This is the circumstance in which the first Wheatstone bridge and the third Wheatstone bridge do not share the sensing elements, as mentioned in the embodiment above. In addition, the sensing elements 120a and 120c marked with "Y" form the second Wheatstone bridge. Also, in this embodiment, the sensing elements 120b and 120d disposed between two adjacent magnetic flux concentrators 110 are not disposed on the central line between the two adjacent magnetic flux concentrators 110 but tend to be close to one of the magnetic flux concentrators 110. However, the sensing element 120a is disposed on the central line between two adjacent magnetic flux concentrators 110.

In the first Wheatstone bridge, as shown in FIG. 7B, the voltage supply terminal VDD is connected to the voltage output terminal $V_{1X}$ through sensing elements 120b1', 120b2, and 120b3' sequentially, and the voltage output terminal $V_{1X}$ is connected to the ground terminal GND through direction magnetic sensors 120b4', 120b5', and 120b6' in sequence. Besides, the voltage supply terminal VDD is connected to the voltage output terminal $V_{2X}$ through sensing elements 120b7', 120b8', and 120b9' sequentially, and the voltage output terminal $V_{2X}$ is connected to the ground terminal GND through sensing elements 120b10', 120b11', and 120b12' sequentially. In addition, the sensing directions S of the sensing elements 120b1' to 120b12' are toward +y direction. Namely, positions and functions of the sensing elements 120b1', 120b2', and 120b3' correspond to the position and function of the sensing element 120b3 in FIG. 4A, positions and functions of the sensing elements 120b4', 120b5', and 120b6' correspond to the position and function of the sensing element 120b1 in FIG. 4A, positions and functions of the sensing elements 120b7', 120b8', and 120b9' correspond to the position and function of the sensing element 120b4 in FIG. 4A, and positions and functions of the sensing elements 120b10', 120b11', and 120b12' correspond to the position and function the sensing element 120b2 in FIG. 4A. Thus, except that the first Wheatstone bridge in FIG. 7B has a different number of the sensing elements 120b from the first Wheatstone bridge in FIG. 4B, and that a connection to the voltage supply terminal VDD and ground terminal GDD in FIG. 7B is reverse to a connection in FIG. 4B, operating principles of the first Wheatstone bridges in FIG. 4A and FIG. 7B are similar and analogical. Therefore, details about operation of the first Wheatstone bridge in FIG. 7B will not be further provided hereinafter.

In addition, in the second Wheatstone bridge of FIG. 7C, the voltage supply terminal VDD is connected to the voltage output terminal $V_{2Y}$ through a sensing element 120a1', and the voltage output terminal $V_{2Y}$ is connected to the ground terminal GND through sensing elements 120c1', 120c2', and 120c3' sequentially. Furthermore, the voltage supply terminal VDD is connected to the voltage output terminal $V_{1Y}$ through sensing elements 120c4', 120c5', and 120c6' sequentially, and the voltage output terminal $V_{1Y}$ is connected to the ground terminal GND through a signal direction magnetic sensor 120a2'. Namely, a position and function of the sensing element 120a1' correspond to the position and function of the sensing element 120a1 of FIG. 5B, positions and functions of the sensing elements 120c1', 120c2', and 120c3' correspond to the position and function of the sensing element 120c2 of FIG. 5B, positions and functions of the sensing elements 120c4', 120c5', and 120c6' correspond to the position and function of the sensing element 120c1 of FIG. 5B, and a position and function of the sensing element 120a2' correspond to the position and function of the sensing element 120a2 in FIG. 5B.

In addition, in the third Wheatstone bridge of FIG. 7D, the voltage supply terminal VDD is connected to the voltage output terminal $V_{1Z}$ through sensing elements 120d4, 120d5, and 120d6 sequentially, and the voltage output terminal $V_{1Z}$ is connected to the ground terminal GND through sensing elements 120d1, 120d2, and 120d3 sequentially. Besides, the voltage supply terminal VDD is connected to the voltage output terminal $V_{2Z}$ through sensing elements 120d9, 120d8, and 120d7 sequentially, and the voltage output terminal $V_{2Z}$ is connected to the ground terminal GND through sensing elements 120d12, 120d11, and 120d10 sequentially. Namely, positions and functions of the sensing elements 120d4, 120d5, and 120d6 correspond to the position and function of the sensing element 120b1 of FIG. 6B, positions and functions of the sensing elements 120d1, 120d2, and 120d3 correspond to the position and function of the sensing element 120b3 of FIG. 6B, the positions and functions of the sensing elements 120d9, 120d8, and 120d7 correspond to the position and function of the sensing element 120b4 of FIG. 6B, and positions and functions of the sensing elements 120d12, 120d11, and 120d10 correspond to the position and function of the sensing element 120b2 of FIG. 6B. In addition, the sensing directions S of the sensing elements 120d1 to 120d12 are toward y direction.

Comparing FIGS. 7A to 7D with FIGS. 4A to 6D, it can be known that the magnetic field sensing module 100d of this embodiment also realizes the first, second and third Wheatstone bridges similar to those of the magnetic field sensing module 100 shown in FIGS. 4A to 6D to achieve multi-axial magnetic field sensing. Besides, compared with the first, second and third Wheatstone bridges of FIGS. 4A to 6D, the first, second, and third Wheatstone bridges in the magnetic field sensing module 100d of this embodiment connects more sensing elements in series, thereby providing a better sensitivity in sensing.

Figure 8A:
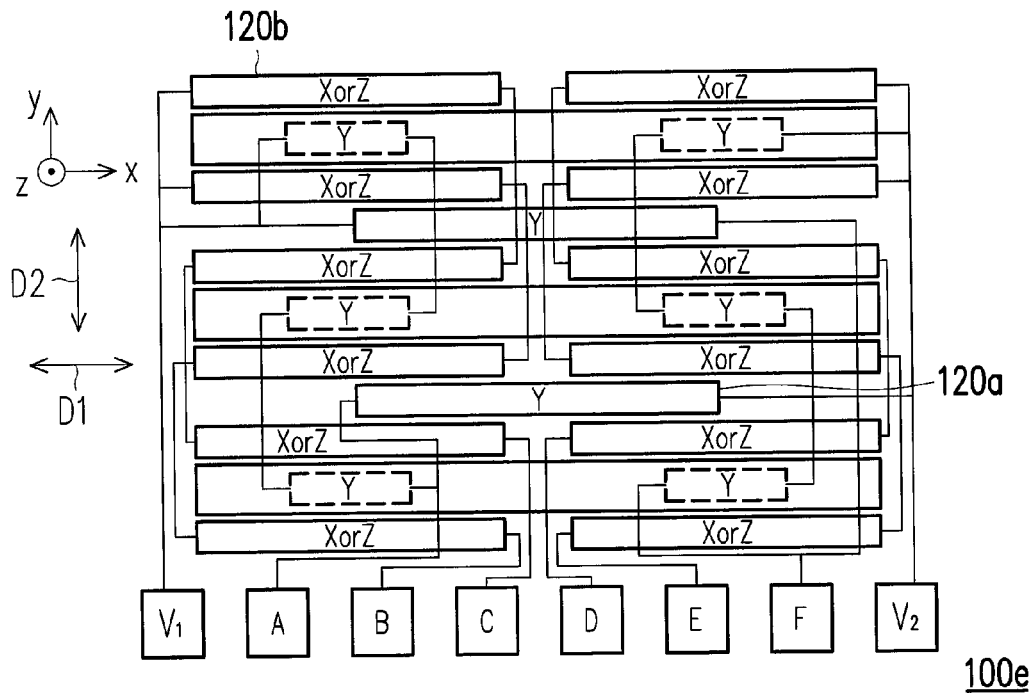
FIG. 8A is a schematic structural top view of a magnetic field sensing module according to yet another embodiment of the invention.
Figure 8B:
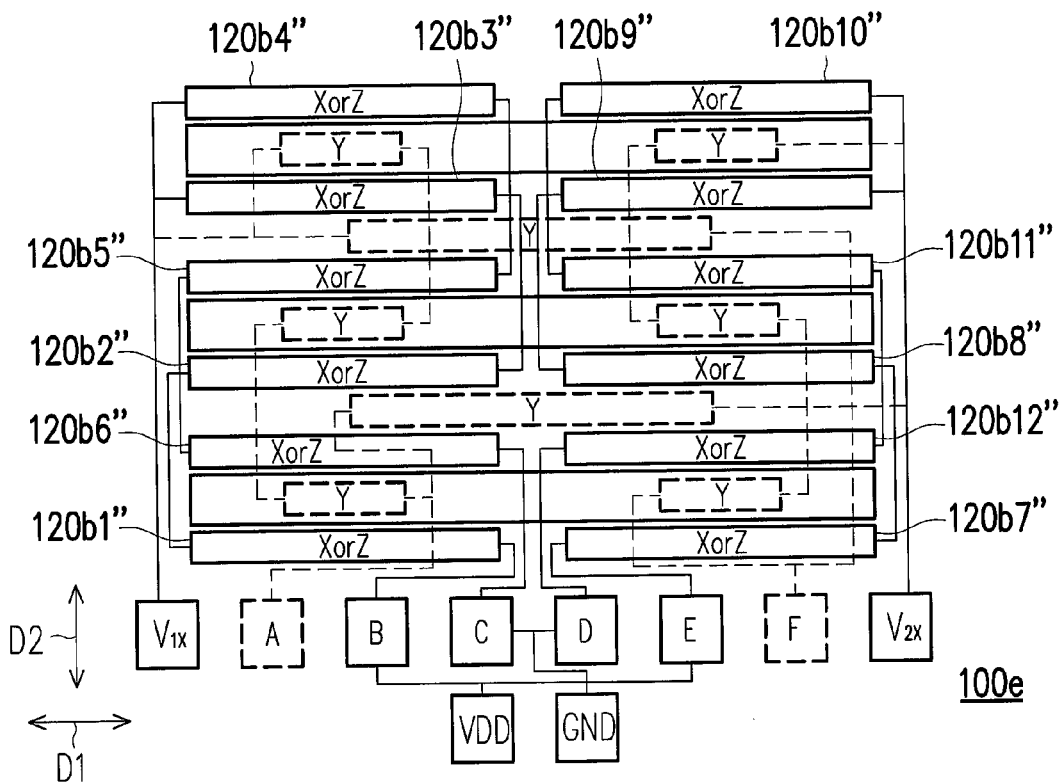
FIG. 8B illustrates a first Wheatstone bridge of the magnetic field sensing module of FIG. 8A for measuring a magnetic field in x direction.
Figure 8C:
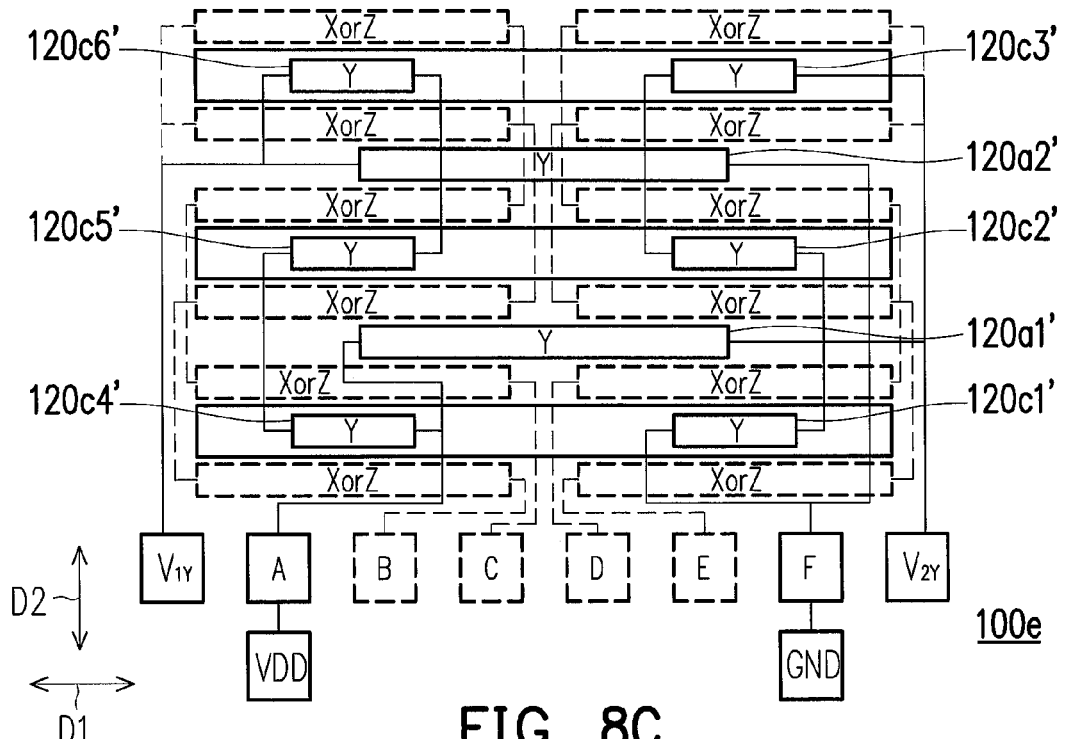
FIG. 8C illustrates a second Wheatstone bridge of the magnetic field sensing module of FIG. 8A for measuring a magnetic field in y direction.
Figure 8D:
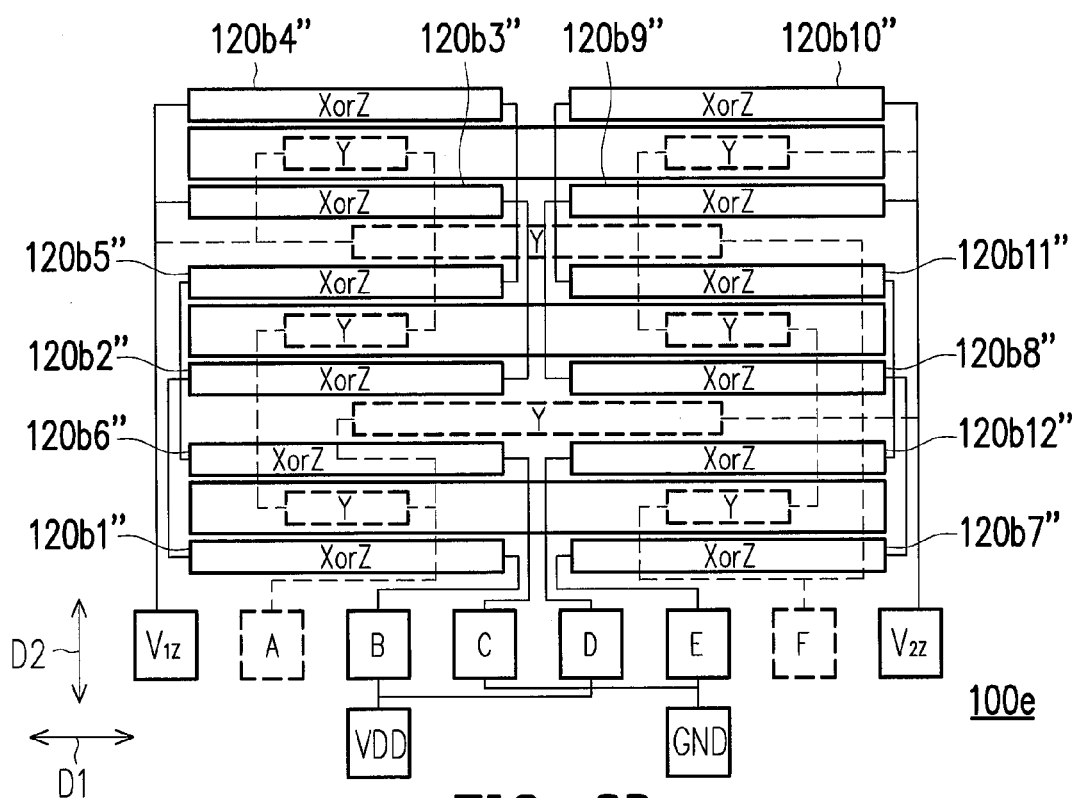
FIG. 8D illustrates a third Wheatstone bridge of the magnetic field sensing module of FIG. 8A for measuring a magnetic field in z direction.

FIG. 8A is a schematic structural top view of a magnetic field sensing module according to yet another embodiment of the invention, FIG. 8B illustrates a first Wheatstone bridge of the magnetic field sensing module of FIG. 8A for measuring a magnetic field in x direction, FIG. 8C illustrates a second Wheatstone bridge of the magnetic field sensing module of FIG. 8A for measuring a magnetic field in y direction, and FIG. 8D illustrates a third Wheatstone bridge of the magnetic field sensing module of FIG. 8A for measuring a magnetic field in z direction. Referring to FIGS. 8A to 8D, a magnetic field sensing module 100e of this embodiment is similar to the magnetic field sensing module 100d of FIGS. 7A to 7D, but differs in that the first and third Wheatstone bridges in the magnetic field sensing module 100e of this embodiment share the sensing elements 120b. In FIGS. 8A to 8B, the sensing elements 120b marked with "X or Z" are configured to respectively detect magnetic fields in x direction and z direction in different sub-periods in a cycle time.

In this embodiment, the first, second, and third Wheatstone bridges are respectively formed in three different sub-periods in a cycle time. When the first Wheatstone bridge is formed, as shown in FIG. 8B, the voltage supply terminal VDD is switched to connect terminals B and E, and the ground terminal is switched to connect terminals C and D. At this time, the voltage supply terminal VDD is connected to a voltage output terminal $V_1$ through sensing elements 120b1", 120b2", and 120b3" sequentially, and the voltage output terminal $V_1$ is connected to the ground terminal GND through sensing elements 120b4", 120b5", and 120b6" sequentially. Besides, the voltage supply terminal VDD is connected to a voltage output terminal $V_2$ through sensing elements 120b7", 120b8", and 120b9" sequentially, and the voltage output terminal $V_2$ is connected to the ground terminal GND through sensing elements 120b10", 120b11", and 120b12".

Namely, positions and functions of the sensing elements 120b1", 120b2", and 120b3" correspond to the position and function of the sensing element 120b3 in FIG. 4A, positions and functions of the sensing elements 120b4", 120b5", and 120b6" correspond to the position and function of the sensing element 120b1 in FIG. 4A, positions and functions of the sensing elements 120b7", 120b8", and 120b9" correspond to the position and function of the sensing element 120b4 in FIG. 4A, and the sensing elements 120b10", 120b11", and 120b12" correspond to the position and function the sensing element 120b2 in FIG. 4A.

When the second Wheatstone bridge is formed, as shown in FIG. 8C, the voltage supply terminal VDD is switched to connect a terminal A, and the ground terminal GND is switched to connect a terminal F. At this time, the voltage supply terminal VDD is connected to the voltage output terminal $V_2$ through the sensing element 120a1', and the voltage output terminal $V_2$ is connected to the ground terminal GND through the sensing elements 120c3', 120c2', and 120c1' sequentially. Furthermore, the voltage supply terminal VDD is connected to the voltage output terminal $V_1$ through the sensing elements 120c4', 120c5', and 120c6' sequentially, and the voltage output terminal $V_1$ is connected to the ground terminal GND through the signal direction magnetic sensor 120a2'.

Namely, the position and function of the sensing element 120a1' correspond to the position and function of the sensing element 120a1 of FIG. 5B, the positions and functions of the sensing elements 120c3', 120c2', and 120c1' correspond to the position and function of the sensing element 120c2 of FIG. 5B, the positions and functions of the sensing elements 120c4', 120c5', and 120c6' correspond to the position and function of the sensing element 120c1 of FIG. 5B, and the position and function of the sensing element 120a2' correspond to the position and function of the sensing element 120a2 in FIG. 5B. Also, the sensing directions S of the sensing elements 120a1', 120a2, and 120c1' to 120c6' are toward y direction.

When the third Wheatstone bridge is formed, as shown in FIG. 8D, the voltage supply terminal VDD is switched to connect the terminals B and D, and the ground voltage GND is switched to connect the terminals C and E. At this time, the voltage supply terminal VDD is connected to the voltage output terminal $V_1$ through the sensing elements 120b1", 120b2", and 120b3" sequentially, and the voltage output terminal $V_1$ is connected to the ground terminal GND through the sensing elements 120b4", 120b5", and 120b6" sequentially. Besides, the voltage supply terminal VDD is connected to the voltage output terminal $V_2$ through the sensing elements 120b12", 120b11", and 120b10" sequentially, and the voltage output terminal $V_2$ is connected to the ground terminal GND through sensing elements 120b9", 120b8", and 120b7".

By switching the voltage output and ground terminals to connect the terminals A-F, the magnetic field sensing module 100e is capable of forming the first, second, and third Wheatstone bridges respectively in three sub-periods in a cycle time to respectively sense the magnetic fields in x direction, y direction, and z direction. Switching of the voltage output and ground terminals with respect to the terminals A to F may be achieved by using a switching circuit in an integrated circuit. The switching circuit may be integrated into an application specific integrated circuit (ASIC), or the whole magnetic field sensing module 100e may also be integrated into a chip with the ASIC.

Compared with the first, second, and third Wheatstone bridges in FIGS. 7A to 7D, which respectively have the sensing elements 120b, 120a, and 120d, the first and third Wheatstone bridges in the magnetic field sensing module 100e of FIGS. 8A to 8D share the sensing elements 120b. Therefore, the magnetic field sensing module 100e of FIGS. 8A to 8D has advantages of being compact in size, simple in design, having a simpler wiring, and using fewer electrode pads. In addition, wiring of the Wheatstone bridges may even be achieved by using a single layer of redistribution layer (RDL). Still, the magnetic field sensing module 100d of FIGS. 7A to 7D has advantage of being capable of independently adjusting voltage gains of the output voltages of the first, second and third Wheatstone bridges. Namely, when the voltages are in an analogical state, the voltage gains thereof may be respectively adjusted. Thus, by independently adjusting the voltage gains, the same magnetic field magnitudes in x, y, and z directions may correspond to voltage values of same magnitude, thereby simplifying computation and design of the back end (e.g. digital circuit).

Referring to FIGS. 1A, 1B, and 1C, an embodiment of the invention provides a measurement method for measuring an external magnetic field. The measurement method includes modifying a magnetic field distribution of the external magnetic field, so as to convert at least a portion of each of a component in the first direction D1, a component in the second direction D2, and a component in the third direction D3 of the external magnetic field to the second direction D2 at a plurality of different positions. In this embodiment, a method of modifying the magnetic field distribution of the external magnetic field includes arranging the plurality of magnetic flux concentrators 110 in the second direction D2 to modify the distribution of the external magnetic field. In addition, each of the magnetic flux concentrators 110 extends along the first direction D1. Modification of the magnetic field is shown in FIGS. 2A to 2C.

In addition, the different positions are, for example, positions at which the sensing elements 120 are disposed. In addition, according to the embodiment shown in FIGS. 4A to 6D, the components $B_X$, $B_Y$, and $B_Z$ of the external magnetic field are directed toward a direction having a component in y direction by the magnetic flux concentrators 110 at different positions. Furthermore, the measurement method further includes respectively sensing a magnitude of a magnetic field in the second direction D2 at the different positions, so as to measure a component magnitude in the first direction D1, a component magnitude in the second direction D2, and a component magnitude in the third direction D3 of the external magnetic field. Namely, based on the embodiment shown in FIGS. 4A to 6D, the sensing elements 120 are disposed at the positions of the sensing elements 120a, 120b, and 120c as shown in FIGS. 4A to 6D, so as to sense the components $B_X$, $B_Y$, and $B_Z$ of the external magnetic field.

The measurement method of this embodiment may include choosing and coupling a first portion of the sensing elements 120 (e.g. the sensing elements 120b) to form the first Wheatstone bridge, choosing and coupling a second portion of the sensing elements 120 (e.g. the sensing elements 120a and 120c) to form the second Wheatstone bridge, and choosing the first portion of the sensing elements 120 (e.g. the sensing elements 120b) to form the third Wheatstone bridge. In addition, the measurement method of this embodiment may respectively use the first, second and third Wheatstone bridges to measure the magnitudes of the component $B_X$ in the first direction D1, the component $B_Y$ in the second direction D2, and the component $B_Z$ in the third direction. In addition, a sequence that the sensing elements 120b are coupled in the third Wheatstone bridge is different from a sequence that the sensing elements 120b are coupled in the first Wheatstone bridge.

In another embodiment, the measurement method may include choosing and coupling the first portion of the sensing elements 120 (e.g. the sensing elements 120b) to form the first Wheatstone bridge, choosing and coupling the second portion of the sensing elements 120 (e.g. the sensing elements 120a and 120c) to form the second Wheatstone bridge, and choosing and coupling an additional third portion of the sensing elements 120 to form the third Wheatstone bridge. In addition, a position and function of the additional third portion correspond to those of the first portion, and the third portion is the sensing elements 120d in FIG. 7A, for example.

In the measurement method of this embodiment, the external magnetic field is converted to the same direction by modifying the magnetic distribution of the external magnetic field. Therefore, multi-axial magnetic field sensing is achieved by sensing the external magnetic field in the same direction. Thus, the measurement method achieves multi-axial magnetic field sensing in a simpler way. In addition, the measurement method may also be realized by using the above other magnetic field sensing modules.

FIGS. 9A to 9F are schematic side views illustrating a work flow of a manufacturing method of a magnetic field sensing module according to an embodiment of the invention. Referring to FIGS. 9A to 9F, the manufacturing method of the magnetic field sensing module of this embodiment may be used to manufacture the magnetic field sensing module 110 or magnetic field sensing modules of other embodiments. Below, manufacture of the magnetic field sensing module 100 is used as an example. The manufacturing method includes the following steps. First, referring to FIG. 9A, a substrate 130 is provided. Then, a magnetic multi-layer structure 150 is formed on the substrate 130. The magnetic multi-layer structure 150 includes at least the pinning layer 122, the pinned layer 124, the spacer layer 126, and the free layer 128 stacked in a bottom-up (or a top-down) manner, for example (as shown in FIG. 3A). In this embodiment, a sensing direction of the magnetic multi-layer structure 150 (i.e. the pinning direction E1 shown in FIG. 3A) is substantially parallel to the second direction D2.

Figure 9A:
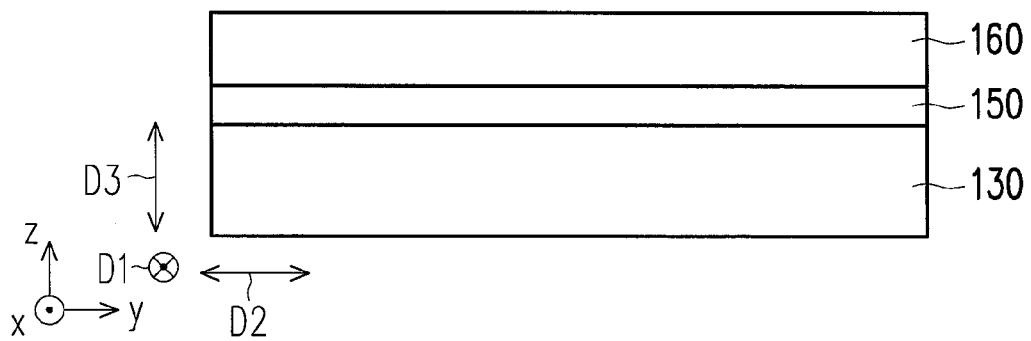
FIGS. 9A to 9F are schematic side views illustrating a work flow of a manufacturing method of a magnetic field sensing module according to an embodiment of the invention.
Figure 9B:
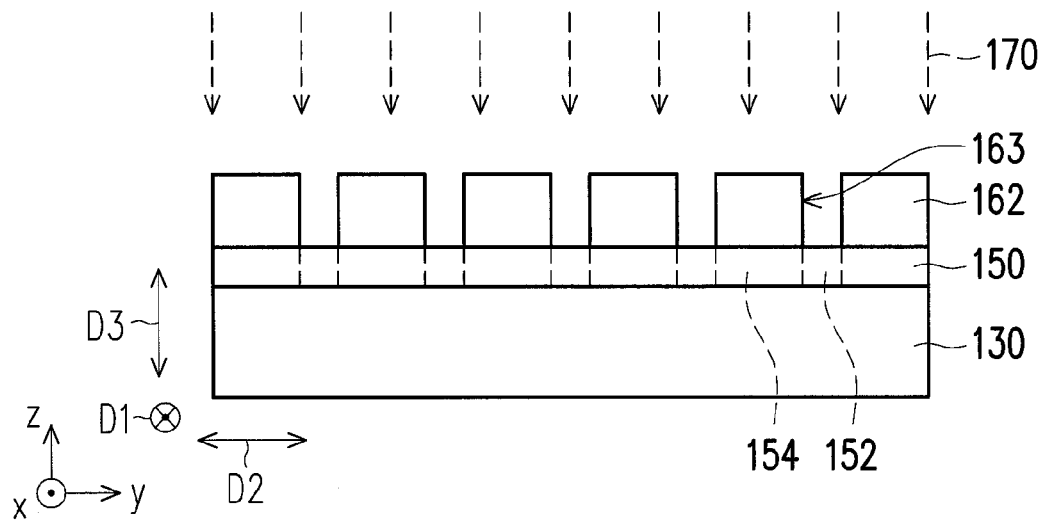

Then, in this embodiment, a photo-resist layer 160 may be formed on the magnetic multi-layer structure 150. Then, as shown in FIG. 9B, the photo-resist layer 160 is patterned, so as to form a patterned photo-resist layer 162. The patterned photo-resist layer 162 has an opening 163 that exposes a first portion 152 of the magnetic multi-layer structure 150, and the patterned photo-resist layer 162 covers a second portion 154 of the magnetic multi-layer structure 150. Patterning of the photo-resist layer 160 may be achieved by using steps in a conventional photolithography process.

Figure 9C:
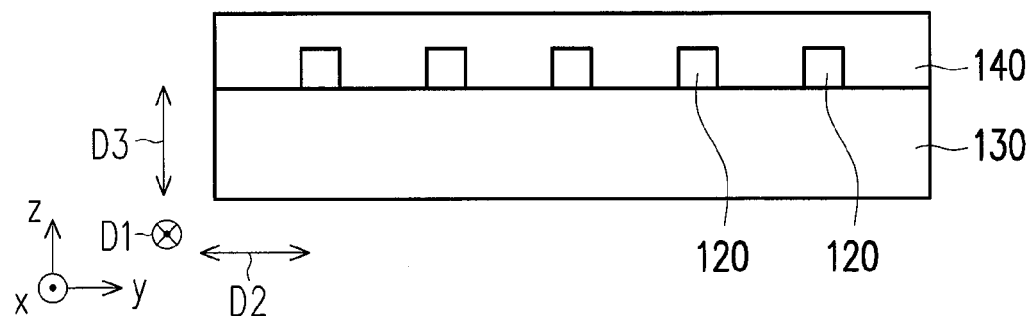

Then, the first portion 152 of the magnetic multi-layer structure 150 is etched, and the remaining second portion 154 of the magnetic multi-layer structure 150 forms the plurality of sensing elements 120 that are separated from each other. In this embodiment, an etching material 170 may be caused to pass through the opening 163 of the patterned photo-resist layer 162, so as to etch the first portion 152 of the magnetic multi-layer structure 150. In addition, the etching material 170 may be an etchant for wet etching or plasma for dry etching. Then, the patterned photo-resist layer 162 is removed. Then, as shown in FIG. 9C, the insulating layer 140 covering the substrate 130 and the sensing elements 120 is formed.

Figure 9D:
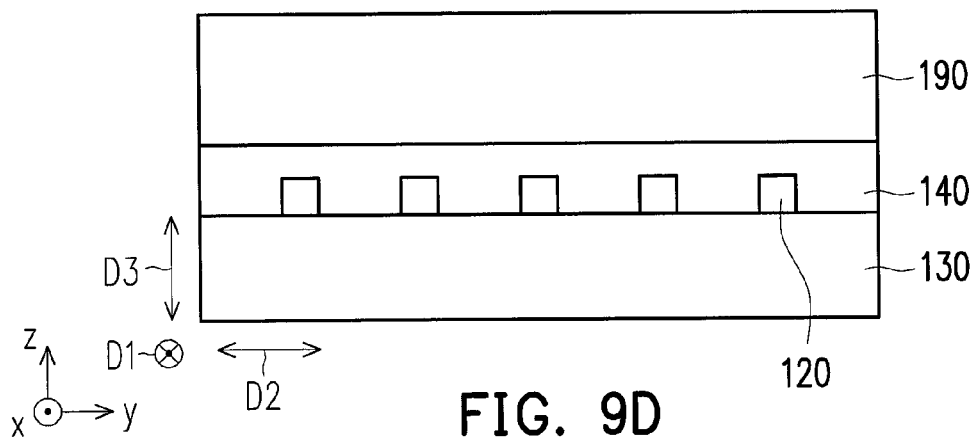
Figure 9E:
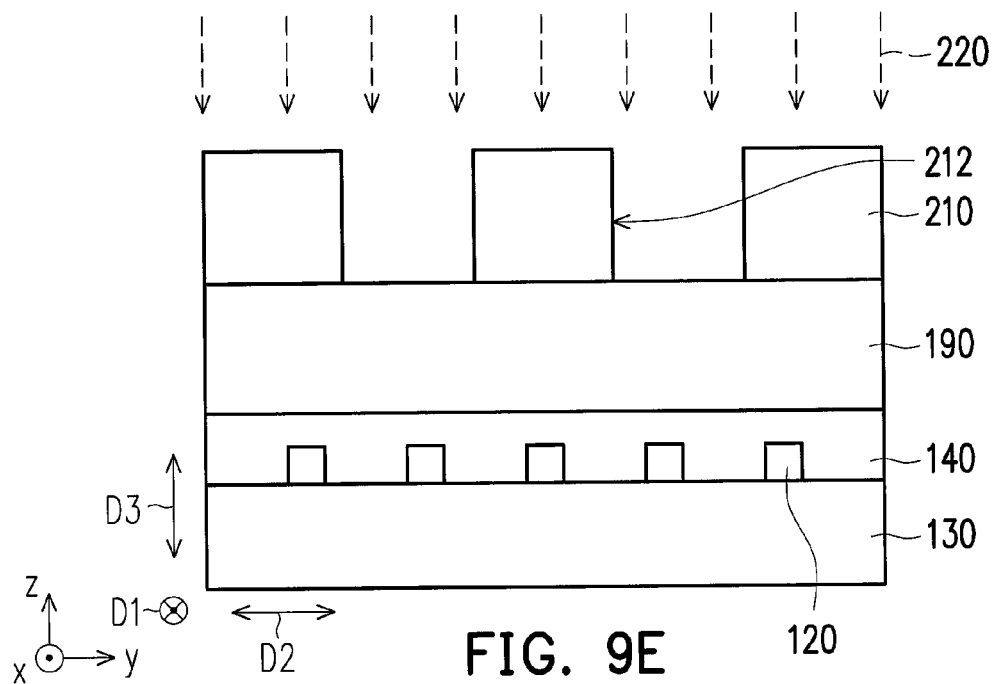
Figure 9F:
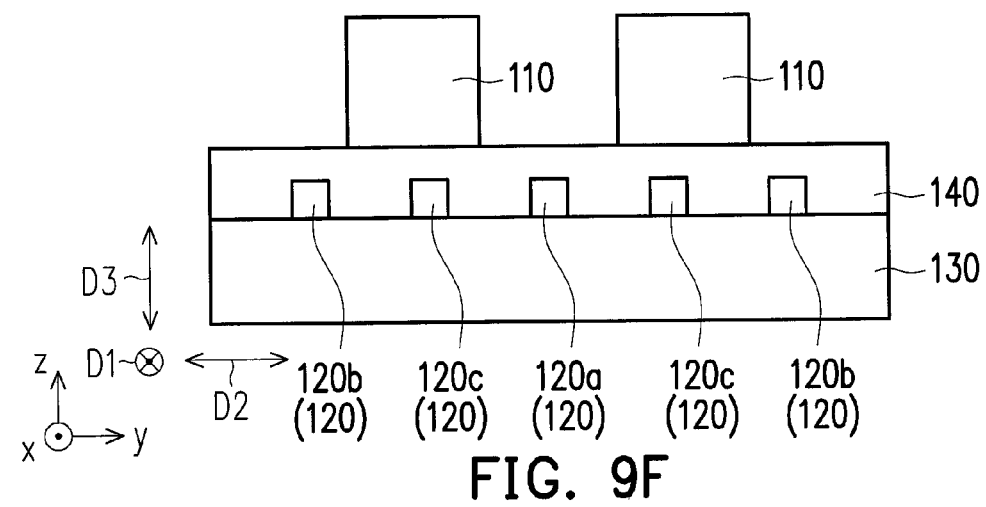

Then, as shown in FIG. 9D, a ferromagnetic material layer 190 is formed on the insulating layer 140. Afterwards, as shown in FIGS. 9E and 9F, the ferromagnetic material layer 190 is patterned, so as to form the plurality of magnetic flux concentrators 110. In this embodiment, after the step shown in FIG. 9D, a patterned photo-resist layer 210 may be formed on the ferromagnetic material layer 190, as shown in FIG. 9E. Formation of the patterned photo-resist layer 210 may include coating a continuous photo-resist layer, and then exposing and developing the continuous photo-resist layer by using the steps in the conventional photolithography process to form the patterned photo-resist layer 210 shown in FIG. 9E. Then, an etching material 220 is caused to pass through an opening 212 of the patterned photo-resist layer 210 to etch a portion of the ferromagnetic material layer 190 that is not covered by the patterned photo-resist layer 210. Remaining of the ferromagnetic material layer 190 that is not etched thus forms the plurality of magnetic flux concentrators 110 separated from each other. Then, the patterned photo-resist layer 210 is removed.

Similar to what is shown in FIG. 1A, each of the magnetic flux concentrators 110 extends along the first direction D1, and the magnetic flux concentrators 110 are arranged along the second direction D2. In this embodiment, the first direction D1 and the second direction D2 are substantially parallel to the substrate 130. The sensing elements 120 are respectively disposed below the position between the magnetic flux concentrators 110 (e.g. the sensing element 120a), below the positions at the two sides of the magnetic flux concentrators 110 arranged in the second direction D2 (e.g. the sensing elements 120b), and under the magnetic flux concentrators 110, such as just under the magnetic flux concentrators 110 (e.g. the sensing elements 120c). Thus, manufacture of the magnetic field sensing module 100 is completed.

In the manufacturing method of the magnetic field sensing module of this embodiment, the magnetic multi-layer structure 150 is etched to form the plurality of sensing elements 120 separated from each other, and then the magnetic flux concentrators 110 are formed to complete the manufacture of the multi-axial magnetic field sensing module 100. Thus, the manufacturing method is capable of manufacturing the magnetic field sensing module capable of multi-axial magnetic field sensing in a simpler manufacturing process, so as to save the time and cost for manufacture. Besides, in the manufacturing method of the magnetic field sensing module of this embodiment, a manufacturing process of a single wafer may be used to complete the manufacture of the magnetic field sensing module 100. Thus, compared with the conventional technology that requires a manufacturing process of two or more wafers to manufacture a multi-axial magnetic field sensing module, the manufacturing method of the magnetic field sensing module of this embodiment is capable of manufacturing the multi-axial magnetic field sensing module with a simpler manufacturing process and lower manufacturing cost.

However, it should be noted that a circuit connection of the first, second, and third Wheatstone bridges is not limited to what is described in the embodiments. Under the same configuration of elements, different circuit connections may be used to form the first, second and third Wheatstone bridges while the same or similar function and effect are achieved. Another embodiment of the invention is thus provided below for exemplification.

Figure 10A:
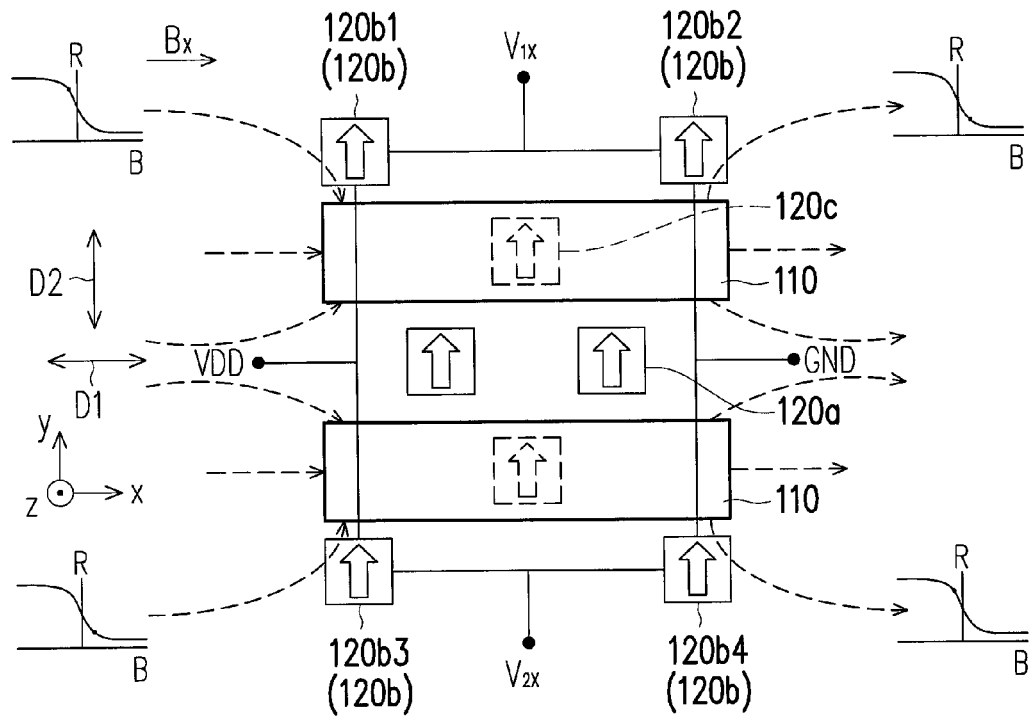
FIG. 10A illustrates variation of resistances of sensing elements when an external magnetic field parallel to x direction is applied to a circuit structure of a magnetic field sensing module according to another embodiment of the invention for sensing a magnetic field parallel to x direction.
Figure 10B:
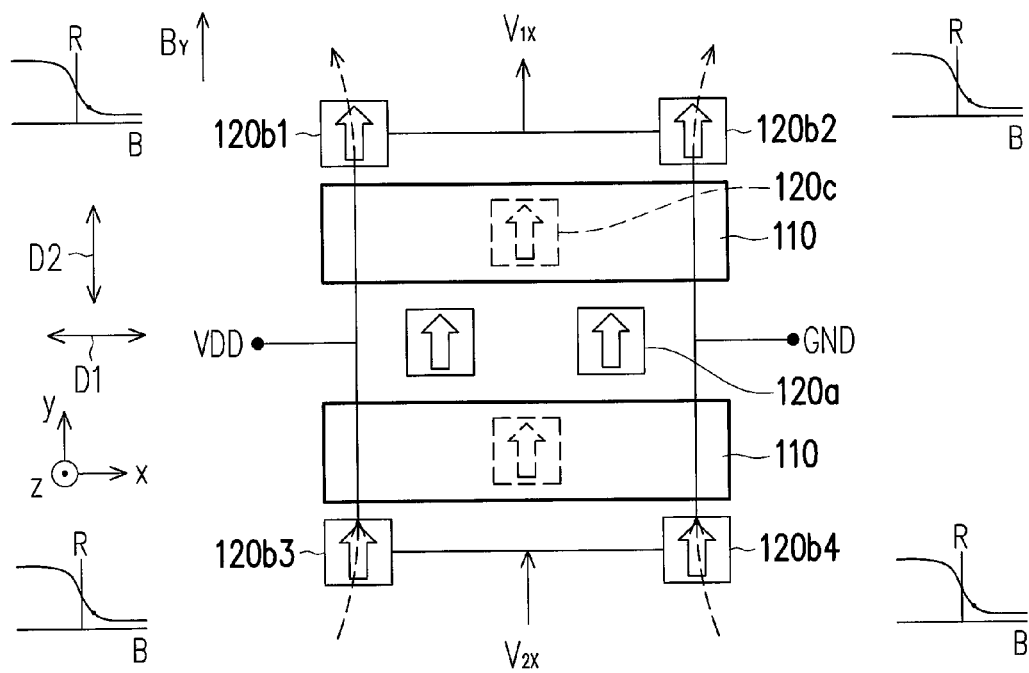
FIG. 10B illustrates variation of resistances of the sensing elements when an external magnetic field parallel to y direction is applied to the circuit structure of FIG. 10A.
Figure 10C:
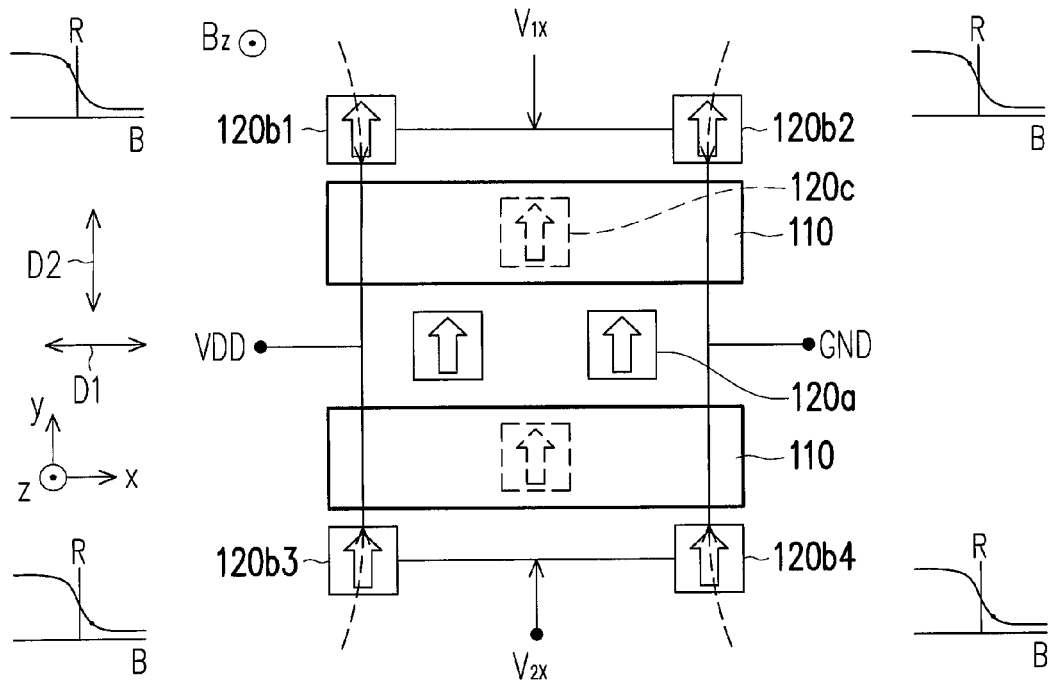
FIG. 10C illustrates variation of resistances of the sensing elements when an external magnetic field parallel to z direction is applied to the circuit structure of FIG. 10A.
Figure 11A:
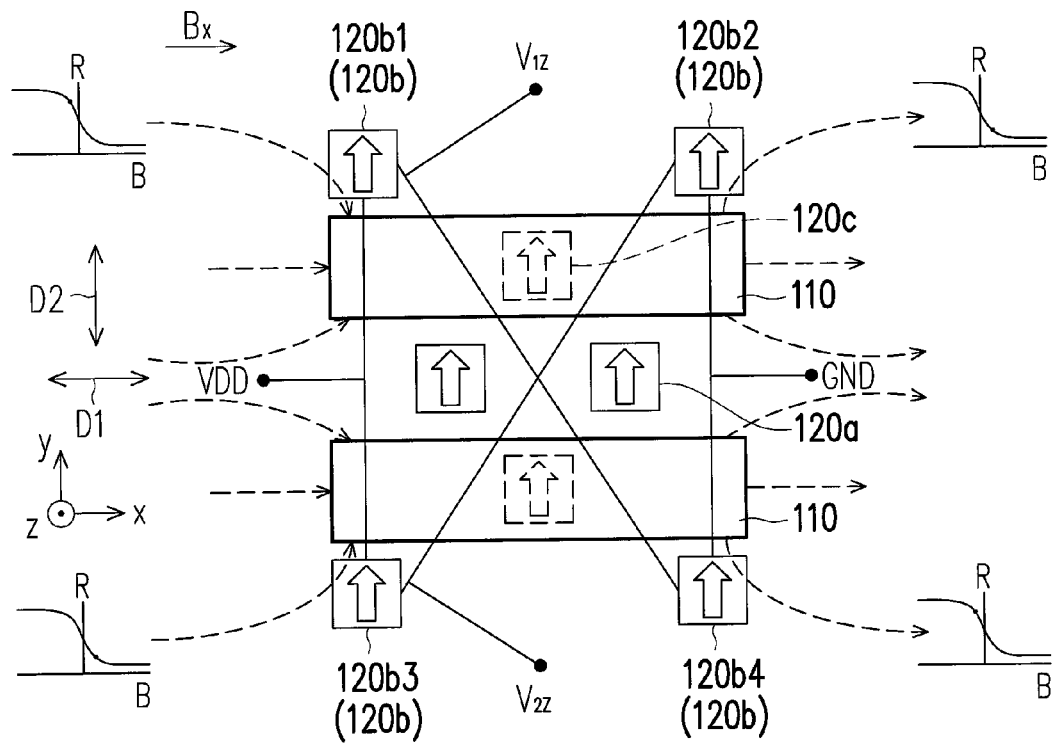
FIG. 11A illustrates variation of resistances of sensing elements when an external magnetic field parallel to x direction is applied to a circuit structure of a magnetic field sensing module according to another embodiment of the invention for sensing a magnetic field parallel to z direction.
Figure 11B:
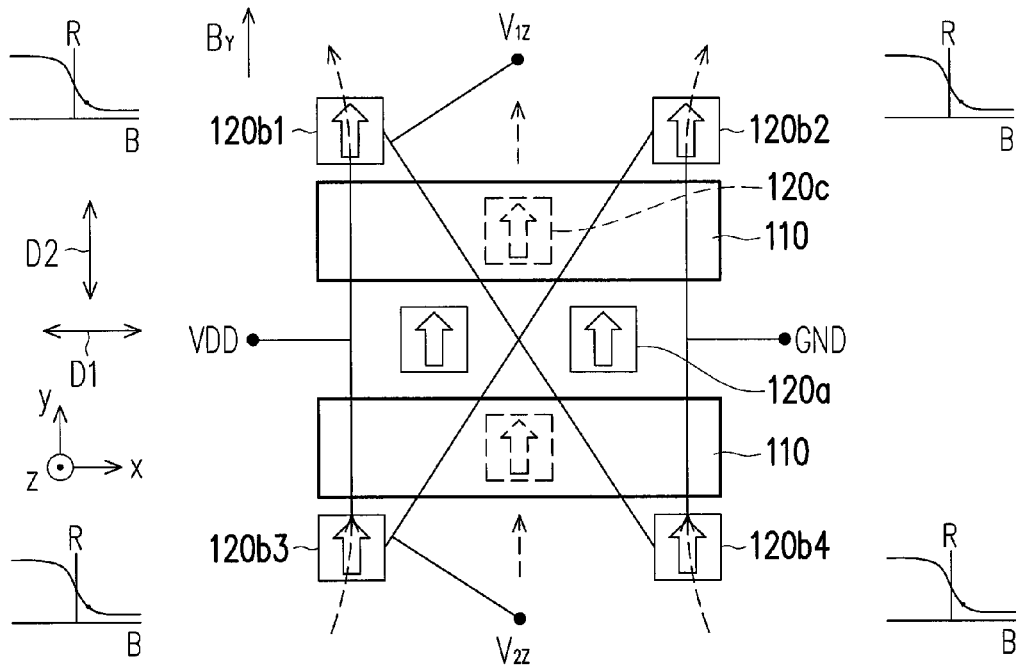
FIG. 11B illustrates variation of resistances of the sensing elements when an external magnetic field parallel to y direction is applied to the circuit structure of FIG. 11A.
Figure 11C:
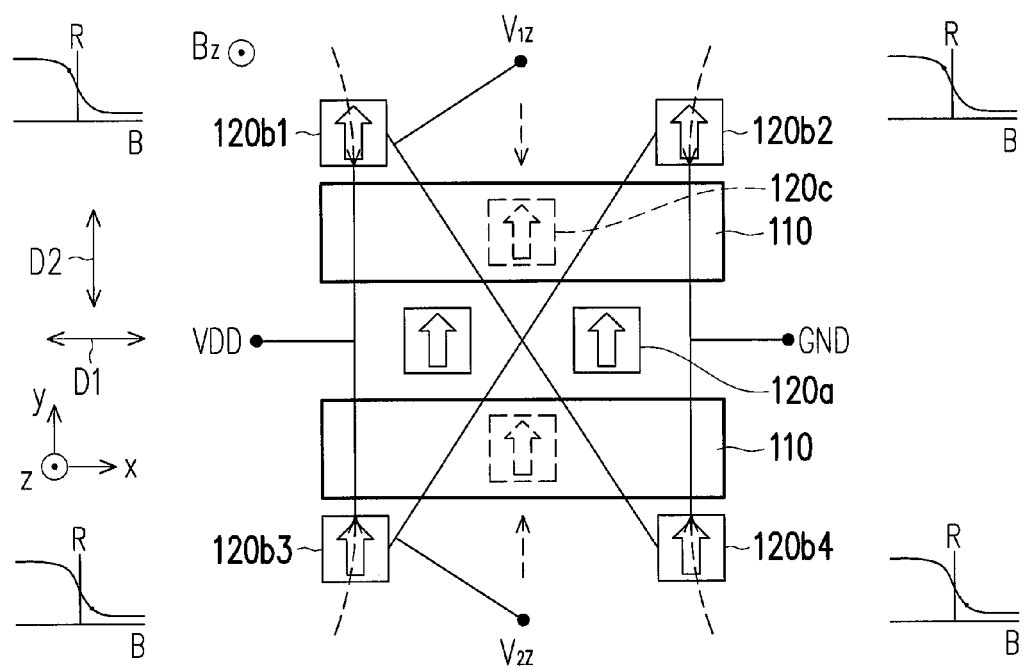
FIG. 11C illustrates variation of resistances of the sensing elements when an external magnetic field parallel to z direction is applied to the circuit structure of FIG. 11A.

FIG. 10A illustrates variation of resistances of sensing elements when an external magnetic field parallel to x direction is applied to a circuit structure of a magnetic field sensing module according to another embodiment of the invention for sensing a magnetic field parallel to x direction. FIG. 10B illustrates variation of resistances of the sensing elements when an external magnetic field parallel to y direction is applied to the circuit structure of FIG. 10A. FIG. 10C illustrates variation of resistances of the sensing elements when an external magnetic field parallel to z direction is applied to the circuit structure of FIG. 10A. FIG. 11A illustrates variation of resistances of sensing elements when an external magnetic field parallel to x direction is applied to a circuit structure of a magnetic field sensing module according to another embodiment of the invention for sensing a magnetic field parallel to z direction. FIG. 11B illustrates variation of resistances of the sensing elements when an external magnetic field parallel to y direction is applied to the circuit structure of FIG. 11A. FIG. 11C illustrates variation of resistances of the sensing elements when an external magnetic field parallel to z direction is applied to the circuit structure of FIG. 11A.

Referring to FIGS. 10A to 10C and FIGS. 11A to 11C, a function of the first Wheatstone bridge of this embodiment, as shown in FIGS. 10A to 10C, is similar to that of the first Wheatstone bridge of FIG. 4A, and a function of the third Wheatstone bridge of this embodiment, as shown in FIGS. 11A to 11C, is similar to that of the third Wheatstone bridge of FIG. 6A, while the difference therebetween is provided in the following. In the first Wheatstone bridge of FIGS. 10A to 10C, the voltage supply terminal VDD is connected to the voltage output terminal $V_{1X}$ through the sensing element 120b1, and the voltage output terminal $V_{1X}$ is connected to the ground terminal GND through the sensing element 120b2. Besides, the voltage supply terminal VDD is connected to the voltage output terminal Vex through the sensing element 120b3, and the voltage output terminal Vex is connected to the ground terminal GND through the sensing element 120b4. In FIG. 10A, since the resistance of the sensing element 120b1 is higher than the sensing element 120b3, while the resistance of the sensing element 120b2 is lower than the resistance of the sensing element 120b4, the voltage of the voltage output terminal $V_{1X}$ is lower than the voltage of the voltage output terminal $V_{2X}$, and the voltage difference between the voltage output terminals $V_{1X}$ and $V_{2X}$ thus forms a signal that corresponds to the component $B_X$ of the external magnetic field. In FIG. 10B, since the resistances of the four sensing elements 120b1 to 120b4 decrease, the voltage difference between the voltage output terminals $V_{1X}$ and $V_{2X}$ is zero, and there is no signal generated. In FIG. 10C, since the resistances of the sensing elements 120b1 and 120b2 decrease, and the resistances of the sensing elements 120b3 and 120b4 decrease, a proportion between the sensing elements 120b1 and 120b2 is substantially equivalent to a proportion between the sensing elements 120b3 and 120b4. Thus, the voltage difference between the voltage output terminals $V_{1X}$ and $V_{2X}$ is zero, and there is no signal generated. Thus, the first Wheatstone bridge of FIG. 10A also realizes sensing in x direction.

In the third Wheatstone bridge shown in FIGS. 11A to 11C, the voltage supply terminal VDD is connected to the voltage output terminal $V_{1Z}$ through the sensing element 120b1, and the voltage output terminal $V_{1Z}$ is connected to the ground terminal GND through the sensing element 120b4. Besides, the voltage supply terminal VDD is connected to the voltage output terminal $V_{2Z}$ through the sensing element 120b3, and the voltage output terminal $V_{2Z}$ is connected to the ground terminal GND through the sensing element 120b4. In FIG. 11A, the resistances of the sensing elements 120b1 and 120b4 increase, and the resistances of the sensing elements 120b3 and 120b2 decrease, so a proportion between the sensing elements 120b1 and 120b4 is substantially equivalent to a proportion between the sensing elements 120b3 and 120b2, and the voltages of the voltage output terminals $V_{1Z}$ and $V_{2Z}$ are thus substantially equivalent. Consequently, the voltage difference between the voltage output terminals $V_{1Z}$ and $V_{2Z}$ is zero, and there is no signal output. In FIG. 11B, the four sensing elements 120b1 to 120b4 decrease, so the voltage difference between the voltage output terminals $V_{1Z}$ and $V_{2}z$ is zero and there is no signal output. In FIG. 11C, the resistance of the sensing element 120b1 is higher than the resistance of the sensing element 120b3, and the resistance of the sensing element 120b4 is lower than the resistance of the sensing element 120b2, so the voltage of the voltage output terminal $V_{1Z}$ is lower than that of the voltage output terminal $V_{2Z}$, and the voltage difference between the voltage output terminals $V_{1Z}$ and $V_{2Z}$ thus forms a signal that corresponds to the component $B_Z$ of the external magnetic field. Consequently, the third Wheatstone bridge shown in FIGS. 11A to 11C may also be used to sense the magnetic field in z direction.

Based on the above, in the magnetic field sensing module in the embodiments of the invention, the external magnetic field is bent by using the magnetic flux concentrators, and the sensing directions of the plurality of sensing elements may be substantially the same, and the magnetic field sensing module may achieve multi-axial magnetic field sensing under a simpler framework, thereby reducing the complexity and cost of manufacture of the magnetic field sensing module. In the measurement method according to the embodiments of the invention, the external magnetic field is converted to the same direction by modifying the magnetic field distribution of the external magnetic field, so as to actually achieve multi-axial magnetic field sensing by sensing the external magnetic field in the same direction. Therefore, the measurement method is capable of achieving multi-axial magnetic field sensing in a simpler way. In the manufacturing method of the magnetic field sensing module according to the embodiments of the invention, the magnetic multi-layer structure is etched to form the plurality of sensing elements separated from each other, then the magnetic flux concentrators are formed to complete the manufacture of the multi-axial magnetic field sensing module. Accordingly, the manufacturing method manufactures the magnetic field sensing module capable of multi-axial magnetic field sensing by use a simpler manufacturing process.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A magnetic field sensing module, comprising:
   a plurality of magnetic flux concentrators, wherein each of the magnetic flux concentrators extends along a first direction, and the magnetic flux concentrators are arranged along a second direction; and
   a plurality of sensing elements, respectively disposed in a position corresponding to a position between the magnetic flux concentrators and positions corresponding to two sides, arranged along the second direction, of the magnetic flux concentrators, wherein the sensing elements disposed in the positions corresponding to the two sides arranged along the second direction are disposed on two opposite sides of a reference plane with a space apart, and the sensing elements disposed on the two opposite sides of the reference plane are spaced apart from each other along the first direction, wherein the reference plane passes through a central region of the magnetic flux concentrators, the reference plane is substantially perpendicular to the first direction, and sensing directions of the sensing elements are substantially the same.

2. The magnetic field sensing module as claimed in claim 1, wherein the sensing directions of the sensing elements are substantially parallel to the second direction.

3. The magnetic field sensing module as claimed in claim 1, wherein the first direction is substantially perpendicular to the second direction.

4. The magnetic field sensing module as claimed in claim 1, wherein a portion of the sensing elements is disposed on one side of the magnetic flux concentrators in a third direction, and the third direction is substantially perpendicular to the first and second directions.

5. The magnetic field sensing module as claimed in claim 4, wherein a portion of the sensing elements disposed in the positions corresponding to the two sides, arranged along the second direction, of the magnetic flux concentrators are coupled to form a first Wheatstone bridge and are configured to sense a component of an external magnetic field in the first direction.

6. The magnetic field sensing module as claimed in claim 5, wherein the sensing elements disposed in the position corresponding to the position between the magnetic flux concentrators and the sensing elements disposed on the one side in the third direction are coupled to form a second Wheatstone bridge and are configured to sense a component of the external magnetic field in the second direction.

7. The magnetic field sensing module as claimed in claim 6, wherein another portion of the sensing elements disposed in the positions on the two sides, arranged along the second direction, of the magnetic flux concentrators are coupled to form a third Wheatstone bridge and configured to sense a component of the external magnetic field in the third direction, wherein a sequence that the sensing elements are coupled in the third Wheatstone bridge is different from a sequence that the sensing elements are coupled in the first Wheatstone bridge.

8. The magnetic field sensing module as claimed in claim 4, wherein the sensing elements disposed in the positions corresponding to the two sides arranged along the second direction, of the magnetic flux concentrators are coupled to faun a first Wheatstone bridge through a first conductive path, and are coupled to form in a third Wheatstone bridge through a second conductive path, wherein the first Wheatstone bridge is configured to sense a component of an external magnetic field in the first direction, the third Wheatstone bridge is configured to sense a component of the external magnetic field in the third direction, and a sequence that the sensing elements are coupled on the first conductive path is different from a sequence that the sensing elements are coupled on the second conductive path.

9. The magnetic field sensing module as claimed in claim 1, further comprising a plurality of resistors that are coupled to form a Wheatstone bridge with the sensing elements disposed in the position corresponding to the position between the magnetic flux concentrators and are configured to sense a component of an external magnetic field in the second direction.

10. The magnetic field sensing module as claimed in claim 1, wherein the sensing elements are giant magnetoresistance sensors, tunneling magnetoresistance sensors, or a combination thereof.

11. The magnetic field sensing module as claimed in claim 1 wherein a residual magnetism of the magnetic flux concentrators is less than 10% of a saturation magnetization of the magnetic flux concentrators.

* * * * *